US 10,509,580 B2

(12) United States Patent
Yap et al.

(10) Patent No.: US 10,509,580 B2
(45) Date of Patent: Dec. 17, 2019

(54) MEMORY CONTROLLER AND METHODS FOR MEMORY COMPRESSION UTILIZING A HARDWARE COMPRESSION ENGINE AND A DICTIONARY TO INDICATE A ZERO VALUE, FULL MATCH, PARTIAL MATCH, OR NO MATCH

(71) Applicant: Intel Corporation, Santa Clara, CA (US)

(72) Inventors: Kirk S. Yap, Westborough, MA (US); Vinodh Gopal, Westborough, MA (US); James D. Guilford, Northborough, MA (US); Sean M. Gulley, Boston, MA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/089,456

(22) Filed: Apr. 1, 2016

(65) Prior Publication Data
US 2017/0285960 A1    Oct. 5, 2017

(51) Int. Cl.
*G06F 3/06* (2006.01)
*G06F 12/00* (2006.01)
*H03M 7/30* (2006.01)

(52) U.S. Cl.
CPC ............. *G06F 3/064* (2013.01); *G06F 12/00* (2013.01); *H03M 7/30* (2013.01); *H03M 7/3084* (2013.01)

(58) Field of Classification Search
CPC .... G06F 3/0605; G06F 3/0613; G06F 3/0616; G06F 3/0626; G06F 3/064; G06F 3/0658;
(Continued)

(56) References Cited

U.S. PATENT DOCUMENTS

| 6,145,069 A | * | 11/2000 | Dye | ................. H03M 7/30 345/501 |
| 6,173,381 B1 | * | 1/2001 | Dye | ................. G06F 12/08 345/555 |

(Continued)

OTHER PUBLICATIONS

Alameldeen et al., "Frequent Pattern Compression : Significance-Based Compression Scheme for L2 Caches," Technical report 1500, Apr. 2004, 14 pages.
(Continued)

*Primary Examiner* — Glenn Gossage
(74) *Attorney, Agent, or Firm* — Nicholson De Vos Webster & Elliott LLP

(57) ABSTRACT

Methods and apparatuses relating to memory compression and decompression are described, including a memory controller and methods for memory compression utilizing a hardware compression engine and a dictionary to indicate a zero value, full match, partial match, or no match. When indices for multiple sections are the same, an entry in the dictionary may be updated with the value of the section that is most recent, in the same order as in the block of data. In one embodiment, a hardware compression engine is to determine when each section of a plurality of sections of a block of data is a zero value, a full match or a partial match to an entry in a dictionary, or a no match to any entry in the dictionary, encode a tag for each section to indicate the one of the zero value, the full match, the partial match, and the no match, encode a literal when the section is the no match, an index to the entry in the dictionary when the section is the full match, and an index to the entry in the dictionary and non-matching bits when the section is the partial match, and update an entry in the dictionary with a value of a section when the section is the no match, wherein tags for the plurality of sections are to be output from the hardware compression engine in a single field, literals for the plurality
(Continued)

of sections are to be output from the hardware compression engine in a single field, indexes for the plurality of sections are to be output from the hardware compression engine in a single field, and non-matching bits for the plurality of sections are to be output from the hardware compression engine in a single field. A hash value may be generated for each of a plurality of sections of a block of data to use as an index in a dictionary.

24 Claims, 16 Drawing Sheets

(58) Field of Classification Search
CPC ...... G06F 3/0661; G06F 3/0673; H03M 7/46; H03M 7/48
See application file for complete search history.

(56) References Cited

U.S. PATENT DOCUMENTS

| | | | |
|---|---|---|---|
| 6,618,831 B2* | 9/2003 | Lippincott | G06F 13/4243 341/61 |
| 6,883,079 B1* | 4/2005 | Priborsky | G06F 3/0613 709/247 |
| RE41,152 E * | 2/2010 | Reynar | G06T 9/005 341/106 |
| 9,015,429 B2* | 4/2015 | Li | G11C 7/1036 711/154 |
| 9,344,114 B1* | 5/2016 | Milner | H03M 7/4062 |
| 2004/0022312 A1 | 2/2004 | Jones et al. | |
| 2007/0005911 A1 | 1/2007 | Yang et al. | |
| 2007/0150497 A1* | 6/2007 | De La Cruz | H03M 7/3084 |
| 2012/0144146 A1 | 6/2012 | Borkenhagen | |
| 2012/0290798 A1 | 11/2012 | Huang et al. | |
| 2015/0280738 A1* | 10/2015 | Fuchs | H03M 7/3088 341/51 |
| 2016/0112062 A1* | 4/2016 | Dalton | H03M 7/3088 341/87 |
| 2016/0283504 A1* | 9/2016 | Guilford | G06F 16/1744 |

OTHER PUBLICATIONS

"Compresses buffers using a dictionary based match and partial match", Sep. 1997, 6 pages [online]. Retrieved from the Internet: <http://www.opensource.apple.com/source/xnu/xnu-1456.1.26/iokit/Kernel/WKdm.h>.

International Search Report and Written Opinion for Application No. PCT/US2017/022375, dated Jun. 9, 2017, 11 pages.

International Preliminary Report on Patentability for Application No. PCT/US2017/022375, dated Oct. 11, 2018, 8 pages.

* cited by examiner

300

|  |  | DW0 | DW1 | DW2 | DW3 |
|---|---|---|---|---|---|
| STAGE 1 | VALUE | 0x61616161 | 0x61616161 | 0x61616170 | 0x00000000 |
|  | HASH (VALUE) | 0xF | 0xF | 0xF | 0x0 |
|  | NEIGHBOR HASH MATCH | NO | YES | YES | NO |
|  | NEIGHBOR POINTER (PTR) | 0x0 | 0x0 | 0x1 | 0x0 |
| STAGE 2 | DICTIONARY UPDATE | NO | NO | YES | NO |
|  | DICTIONARY LOOKUP (e.g., WORD) | 0x00000001 | 0x00000001 | 0x00000001 | 0x00000001 |
|  | NEIGHBOR LOOKUP (e.g., WORD) | 0x61616161 | 0x61616161 | 0x61616161 | 0x61616161 |
|  | WORD TO COMPARE | 0x00000001 | 0x61616161 | 0x61616161 | 0x00000001 |
|  | FULL MATCH | NO | YES | NO | NO |
|  | PARTIAL MATCH | NO | NO | YES | NO |
|  | ZERO | NO | NO | NO | YES |
|  | LITERAL | YES | NO | NO | NO |
| STAGE 3 | TAG | 10 | 11 | 01 | 00 |
|  | LITERAL | 0x61616161 | NA | NA | NA |
|  | INDEX (e.g., POSITION BITS) | 0xF | 0xF | 0xF | 0x0 |
|  | NON-MATCHING (e.g., LOW) BITS | NA | NA | 0x170 | NA |

FIG. 3

| DICTIONARY 400 | | |
|---|---|---|
| INDEX | INITIAL VALUE | VALUE AFTER 1ST GROUP |
| 0 | 0x00000001 | 0x00000001 |
| 1 | 0x00000001 | 0x00000001 |
| 2 | 0x00000001 | 0x00000001 |
| 3 | 0x00000001 | 0x00000001 |
| 4 | 0x00000001 | 0x00000001 |
| 5 | 0x00000001 | 0x00000001 |
| 6 | 0x00000001 | 0x00000001 |
| 7 | 0x00000001 | 0x00000001 |
| 8 | 0x00000001 | 0x00000001 |
| 9 | 0x00000001 | 0x00000001 |
| A | 0x00000001 | 0x00000001 |
| B | 0x00000001 | 0x00000001 |
| C | 0x00000001 | 0x00000001 |
| D | 0x00000001 | 0x00000001 |
| E | 0x00000001 | 0x00000001 |
| F | 0x00000001 | 0x61616170 |

FIG. 4

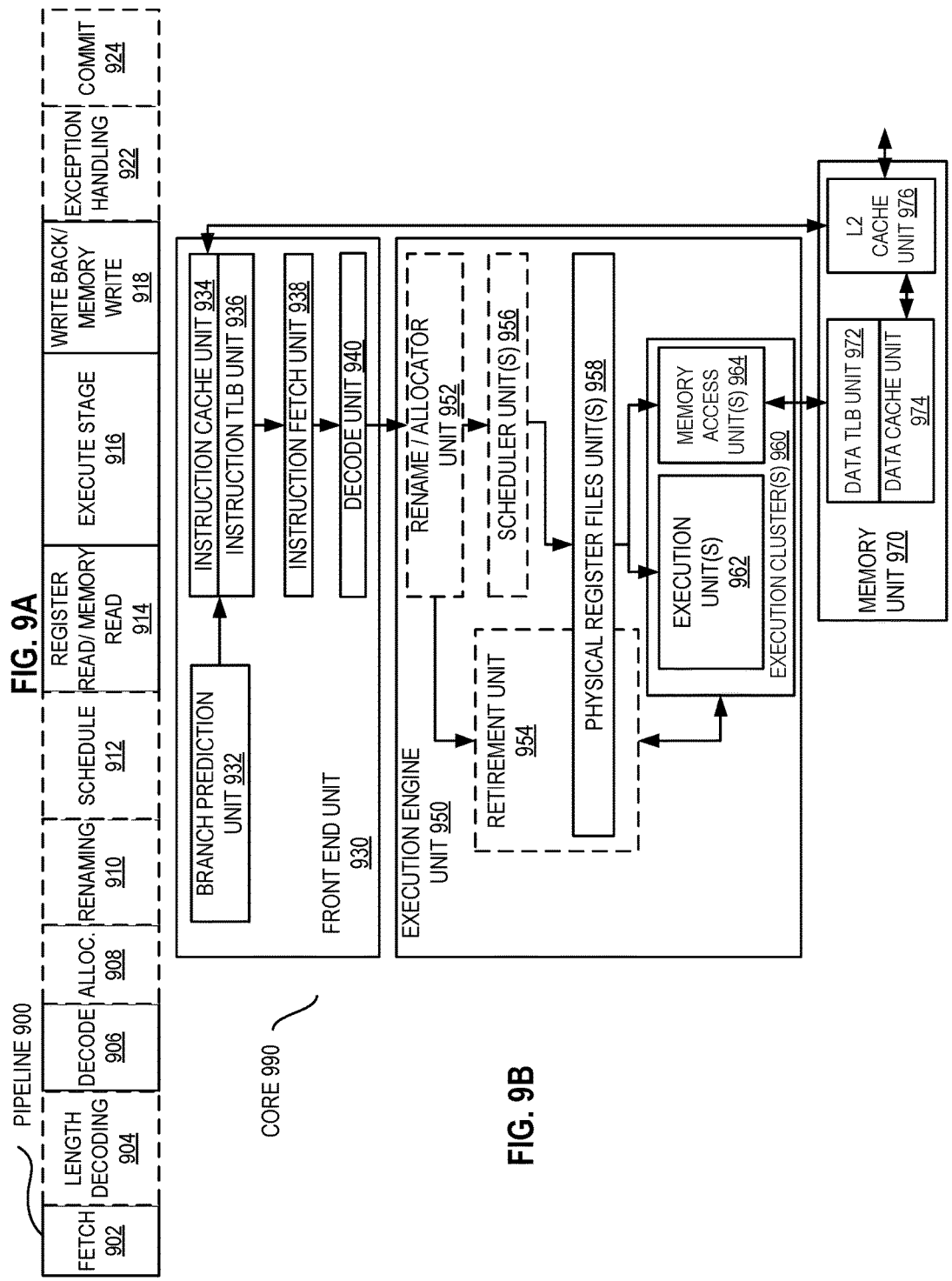

MEMORY CONTROLLER AND METHODS FOR MEMORY COMPRESSION UTILIZING A HARDWARE COMPRESSION ENGINE AND A DICTIONARY TO INDICATE A ZERO VALUE, FULL MATCH, PARTIAL MATCH, OR NO MATCH

TECHNICAL FIELD

The disclosure relates generally to electronics, and, more specifically, an embodiment of the disclosure relates to a hardware memory controller for memory compression and/or decompression.

BACKGROUND

A processor, or set of processors, executes instructions from an instruction set, e.g., the instruction set architecture (ISA). The instruction set is the part of the computer architecture related to programming, and generally includes the native data types, instructions, register architecture, addressing modes, memory architecture, interrupt and exception handling, and external input and output (I/O). It should be noted that the term instruction herein may refer to a macro-instruction, e.g., an instruction that is provided to the processor for execution, or to a micro-instruction, e.g., an instruction that results from a processor's decoder decoding macro-instructions.

BRIEF DESCRIPTION OF THE DRAWINGS

The present disclosure is illustrated by way of example and not limitation in the figures of the accompanying drawings, in which like references indicate similar elements and in which:

FIG. 3 illustrates stages of a compression operation according to embodiments of the disclosure.

FIG. 4 illustrates a dictionary according to embodiments of the disclosure.

FIG. 9A is a block diagram illustrating both an exemplary in-order pipeline and an exemplary register renaming, out-of-order issue/execution pipeline according to embodiments of the disclosure.

FIG. 9B is a block diagram illustrating both an exemplary embodiment of an in-order architecture core and an exemplary register renaming, out-of-order issue/execution architecture core to be included in a processor according to embodiments of the disclosure.

DETAILED DESCRIPTION

In the following description, numerous specific details are set forth. However, it is understood that embodiments of the disclosure may be practiced without these specific details. In other instances, well-known circuits, structures and techniques have not been shown in detail in order not to obscure the understanding of this description.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

A (e.g., hardware) processor (e.g., having one or more cores) may execute instructions to operate on data, for example, to perform arithmetic, logic, or other functions. A hardware processor may access data in a memory. In one embodiment, a hardware processor (e.g., having a memory controller) is a client requesting access to (e.g., load or store) data and the memory is a server containing the data. In one embodiment, a computer includes a hardware processor requesting access to (e.g., load or store) data and the memory is local to the computer. Memory may be divided into separate sections of data that may be managed as a unit for coherence purposes. Each section of data may be 512 bits, 256 bits, 128 bits, 64 bits (e.g., a quadword), 32 bits (e.g., a doubleword), 16 bits (e.g., a word), or 8 bits (e.g., a byte) of data. For example, a block of data may be 512 bytes, 256 bytes, 128 bytes, 64 bytes, 32 bytes, 16 bytes, or 8 bytes of data (e.g., of data sections of a block of data). In one embodiment, a section or block of data is less than 4 kilobytes (kB).

In certain embodiments when transferring data, it may be desirable to compress the data for transmittal, for example, to compress the data to take up less bandwidth across a coupling and then to decompress the data for use. For example, a memory controller may compress and/or decompress data to achieve performance improvement to a system. Certain embodiments of compression and/or decompression may provide a higher (e.g., memory) capacity, higher effective bandwidth, power saving, read latency reduction, or any combination of these. For example, a memory controller may be used with data transfer over an interconnect, bus, or other coupling.

Figure 1:
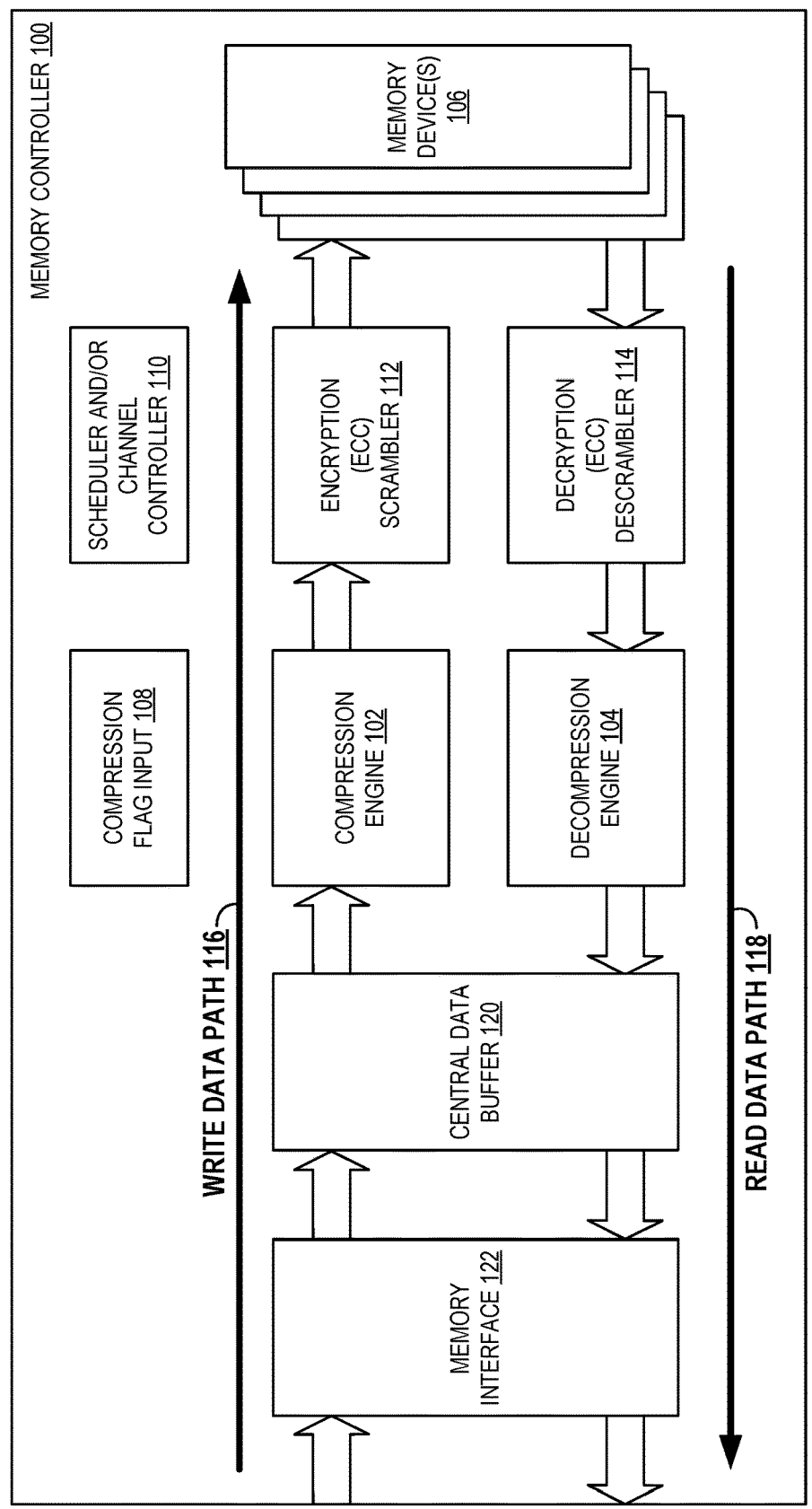
FIG. 1 illustrates a hardware memory controller according to embodiments of the disclosure.

Turning now to the Figures, FIG. 1 illustrates a hardware memory controller 100 according to embodiments of the disclosure. Depicted memory controller 100 includes a compression engine 102 (e.g., compression circuit) and a decompression engine 104 (e.g., decompression circuit). In one embodiment, a memory controller or other circuit may include one or both of a compression engine and a decompression engine. Depicted compression engine 102 receives data to be compressed (e.g., a plurality of sections of a block of data to be compressed) and outputs the compressed data (e.g., compressed according to the disclosure herein). For example, a compression engine may output the compressed data to one or more memory devices 106 for storage. Depicted decompression engine 104 receives data to be decompressed (e.g., a plurality of sections of a block of compressed data to be decompressed) and outputs the decompressed data (e.g., decompressed according to the disclosure herein). For example, a decompression engine may receive as input the compressed data stored in one or more memory devices 106. In one embodiment, memory devices 106 are in a server, e.g., remotely from the requesting memory controller. In one embodiment, memory controller includes compression flag input 108, e.g., to receive one or more flags that indicate that data is to be compressed, which type of compression, etc. In one embodiment, a compression flag indicates the size (e.g., data width) of each of a plurality of sections of a block of data to be compressed and/or decompressed. In one embodiment, a compression flag indicates the number of sections of a block of data to be compressed and/or decompressed, e.g., the number of sections to be grouped together with a single tag as discussed below. A first compressed plurality of data sections (e.g., a first group) may have a different size than a second compressed plurality (same number of data sections) of data sections (e.g., a second group).

In certain embodiments, a memory controller includes a scheduler and/or channel controller 110. In one embodiment, a scheduler is to schedule access to the one or more memory devices 106. In one embodiment, a memory device includes a plurality of channels to allow access (e.g., along a write data path 116) to the memory device(s). A channel controller may control which request to access the memory device(s) is allowed on a certain channel, for example, to avoid two simultaneous accesses to the same channel.

In certain embodiments, a memory controller includes an encryption scrambler 112, e.g., on the write data path 116 between the compression engine 102 and the one or more memory devices 106. Encryption scrambler 112 (e.g., encryption scrambler circuit) may encrypt the compressed data output from compression engine 102, e.g., before storage of the encrypted, compressed data in the one or more storage devices 106. Encryption scrambler 112 (or other circuit) may generate an error correction code (ECC).

In certain embodiments, a memory controller includes a decryption descrambler 114, e.g., on the read data path 118 between the decompression engine 104 and the one or more memory devices 106. Decryption descrambler 114 (e.g., decryption descrambler circuit) may decrypt the compressed data read from one or more memory devices 106, e.g., before transmittal of the decrypted, compressed data to the decompression engine 104. Decryption descrambler 114 (or other circuit) may check the error correction code (ECC) included with the compressed data, e.g., to determine if the data received with the ECC matches the data originally transmitted (stored) with that ECC.

Memory controller 100 may include a central data buffer 120, e.g., to buffer (e.g., temporarily store) data input and/or output into memory controller. Memory controller 100 may include a memory interface 122, for example, to couple with a requestor (e.g., a processor core) of data. In one embodiment, memory interface is an interface to random-access memory (RAM) of a computing system (e.g., a computer). In one embodiment, memory controller as discussed herein may be utilized with any apparatus (e.g., processor), method, or system herein, e.g., as in any of the figures.

Figure 2:
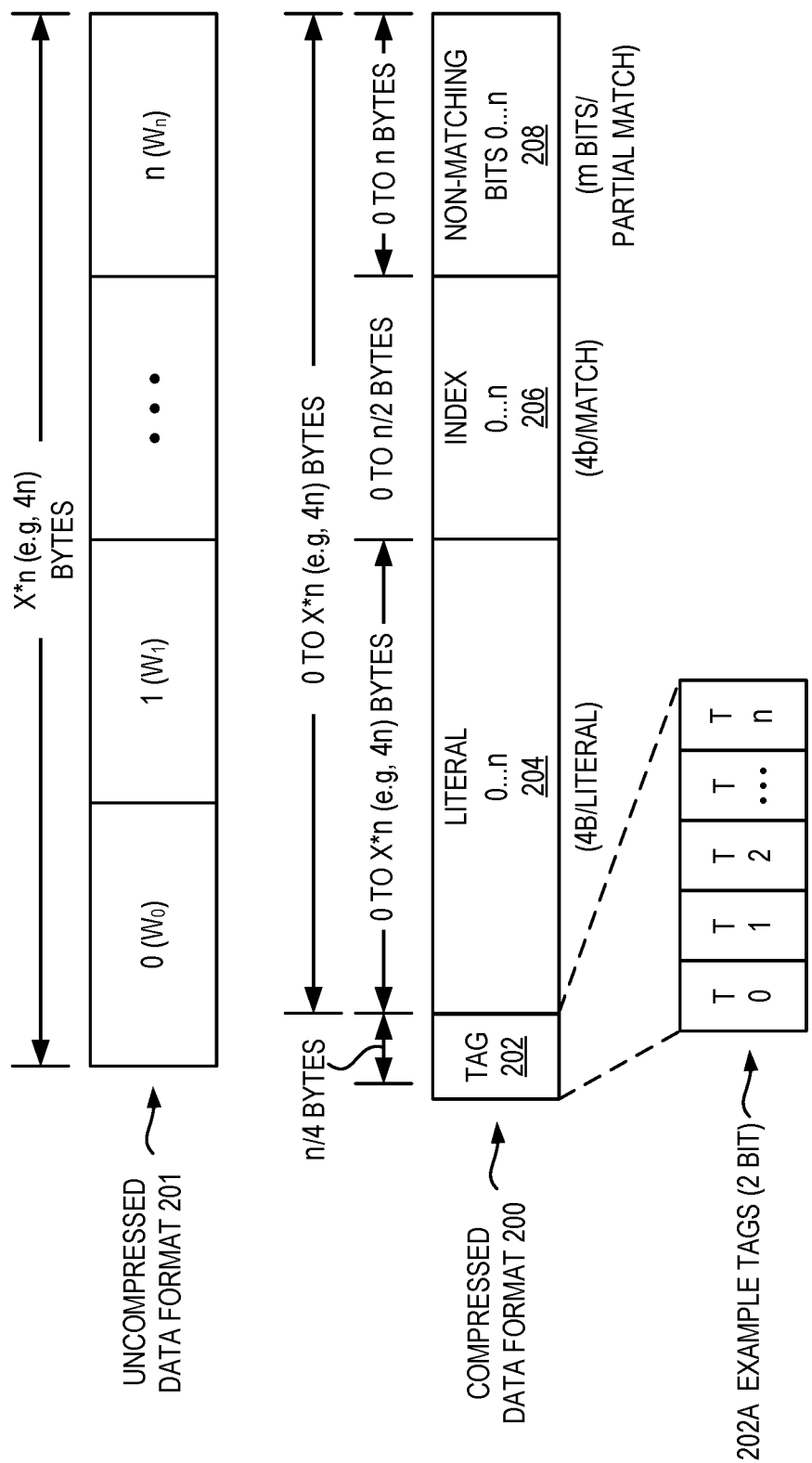
FIG. 2 illustrates a compression format according to embodiments of the disclosure.

FIG. 2 illustrates a compression format according to embodiments of the disclosure. Uncompressed data format 201 may be a plurality of sections (of a total "n+1" sections) (e.g., separate sections of data that may be managed as a unit for coherence purposes) grouped together for compression (e.g., the respective fields of each grouped together). In certain examples herein, each section may be discussed as having a size of a word (W) (or a doubleword (dword)), however this disclosure is not so limited. In certain embodiments, the n (or n+1) value is set into a memory controller (e.g., a compression engine and/or decompression engine) by setting it as a static value (e.g., during manufacture), in a control register (e.g., written into with the value), or as a portion of a tag (e.g., in tag field 202 in FIG. 2) (e.g., as a bit or sequence of bits that indicates the value).

Each section may be a plurality of bits or bytes, e.g., each section being of size "X". In certain embodiments, the X value is set into a memory controller (e.g., a compression engine and/or decompression engine) by setting it as a static value (e.g., during manufacture), in a control register (e.g., written into with the value of X), or as a portion of a tag (e.g., in tag field 202 in FIG. 2) (e.g., as a bit or sequence of bits that indicates the value of X).

In one embodiment, the value of the n (or n+1) and/or X parameters are chosen based on how much throughput is being targeted. For example, to achieve compression of 16 bytes per clock cycle of a compression engine and using a 32 bit size of X, n+1 (or n) is set to 4, e.g., 4 doublewords are processed together at a time. In one embodiment, the n+1 (or n) and/or X parameters are chosen based on the nature of the data type(s) to be compressed. For example, the X parameter may default to 32 bits, but, for example, if double-precision floating point data type is expected, X may be 64 bits, e.g., to result in better compression.

Compressed data format 200 includes four fields. A tag field 202, a literal field 204, an index field 206 (e.g., position field), and a non-matching bits field 208. The order of fields is an example and any order may be used in certain embodiments. In one embodiment (not depicted), a single value in tag field may be included for every 2, 3, 4, 5, 6, 7, 8, 9, 10, 15, 20, 30, 40, 50, 100, etc. data sections that are compressed. Example tag 202A for a compression section of data of size n+1 includes one tag for each plurality of n+1 data sections that are packed (e.g., concatenated) into the tag 202A.

A match may be match of all (a full match) or part (a partial match) of a value of a first data section with a value of a second data section, for example, that is stored in a dictionary, e.g., dictionary 400 in FIG. 4. A dictionary may be a data structure (e.g., table), for example, stored in memory in a memory controller or in other memory. In one embodiment, a full match is where each bit of a first data section matches a corresponding bit in a second data section (e.g., a full bitwise match). In one embodiment, a partial match is where each bit of a (e.g., continuous) subset of less than all bits in a first data section matches a corresponding bit in a second data section. For example, a subset of less than all of the bits of a data section may include a most significant bit (MSB) or a least significant bit (LSB) of the data section. For example, a subset of less than all of the bits of a data section may include a number of bits that are checked as starting from the MSB or LSB. For example, the number of bits that may be non-matching (e.g., with the other bits matching for a partial match) may be referred to as "m", see, e.g., non-matching bits field 208. The subset of bits that are (e.g., checked for) matching may be bit positions [MSB to m] and the subset of bits that are non-matching may be bit positions [(m−1) to LSB (e.g., 0)]. In one embodiment, m is a multiple of four, eight, sixteen, thirty-two, or sixty-four. In certain embodiments, the m value is set into a memory controller (e.g., a compression engine and/or decompression engine) by setting it as a static value (e.g., during manufacture), in a control register (e.g., written into with the value of m), or as a portion of a tag (e.g., in tag field 202 in FIG. 2) (e.g., as a bit or sequence of bits that indicates the value of m).

In one embodiment, the bit positions that are checked only for a partial match (e.g., the "m" parameter in an example above) is chosen by (e.g., preemptively before beginning the compression operation) running compression ratio experiments (e.g., with a hardware processor) on representative data. In one embodiment, the larger the value of the number of bits checked for a partial match (e.g., "m"), the easier it may be to achieve a partial match (e.g., helping compression ratio), but more bits may have to be stored in the compressed data (e.g., hurting compression ratio). In one embodiment, the number of bits checked for a partial match is chosen to be a multiple of four, e.g., to keep the tags and sections of data nibble aligned. In certain embodiments, this may (e.g., greatly) help the decompression critical path and may not impact the compression ratio (e.g., the ratio of sizes of the compressed to original (decompressed) data).

In one embodiment, tag field 202 includes a two bit tag for each data section (n+1). In one embodiment, each of the two bit combinations (00, 01, 10, 11) is assigned to represent that a section of data (e.g., being compressed or decompressed) is one of a zero value, a full match to an entry in a dictionary, a partial match to an entry in a dictionary, or a literal (e.g., there is no match to any entry in a dictionary). For example, in the embodiment in FIG. 3, a zero value is a tag of 00, a full match to an entry in a dictionary is a tag of 11, a partial match to an entry in a dictionary is a tag of 01, and a literal is a tag of 10. For example, in one embodiment, a block of data is 256 bytes and throughput is 16 bytes per cycle.

In one embodiment, a hash (e.g., hash value from a hash generator) for each data section is used to generate an index into the dictionary for each of the data sections. For example, a hash generator may only use the bits from those bit positions that are checked for a partial match (e.g., not the additional bits that are checked for a full match) to generate the index. One example of a hash function is discussed below in reference to FIG. 3, however other hash functions may be utilized in certain embodiments. In addition to the compression formats discussed herein, the hash (e.g., hash function) may be modified to achieve better compression in certain embodiments. For example, the hash function may be chosen after (e.g., a hardware processor) going through a series of experiments on representative memory traces and picking the hash that results in the best (e.g., most) compression, e.g., essentially based on reduction with a primitive binary polynomial of degree four. A compression (e.g., hardware) engine and/or decompression (e.g., hardware) engine may utilize any of this disclosure to compress and/or decompress data, respectively.

FIG. 3 illustrates stages of a compression operation 300 according to embodiments of the disclosure. NA generally refers to Not Applicable. FIG. 4 illustrates a dictionary 400 according to embodiments of the disclosure. Referring to both FIGS. 3 and 4, a compression engine may perform the following. Note that each section has a size "X" of 32 bits, although this is merely an example, e.g., each section may be a plurality of bits or bytes. In this example, the 32 bit sections (e.g., doublewords) are processed in groups composed of four (e.g., (n+1)=4) 32 bit sections. Again, this is merely an example and other values may be utilized. Although hexadecimal format is used here, any format of data (e.g., binary) may be utilized. Note that stages are listed in FIG. 3, but again, these are merely examples. FIG. 4 shows the initial values (0x00000001) stored in the dictionary 400 at the start of processing a block (e.g. of 256 bytes) of data.

The first row in FIG. 3 is the reference name of the four section (e.g., doublewords) to be processed in the first group (e.g., first plurality of data sections). The second row in FIG. 3 are the respective values. In a compression engine (e.g., in a first stage) (e.g., see also FIG. 6), each section (e.g., doubleword) may be hashed using a hash function that compresses (e.g., part of) a doubleword (e.g., to 4 bits). In this embodiment, the hash function is the four following equations with hash[bit position value] indicating the bit position in the outputted hash value.

$$\text{hash}[0]=\text{data section}[15]\char`\^\text{data section}[16]\char`\^\text{data section}[17]\char`\^\text{data section}[18] \quad (1)$$

$$\text{hash}[1]=\text{data section}[14]\char`\^\text{data section}[18]\char`\^\text{data section}[19] \quad (2)$$

$$\text{hash}[2]=\text{data section}[13]\char`\^\text{data section}[17]\char`\^\text{data section}[18]\char`\^\text{data section}[19] \quad (3)$$

$$\text{hash}[3]=\text{data section}[12]\char`\^\text{data section}[16]\char`\^\text{data section}[17]\char`\^\text{data section}[18]\char`\^\text{data section}[19] \quad (4)$$

The ^ symbol is the bitwise exclusive OR (XOR) operation (for example, outputting a true (e.g., logical one) if an odd number of its multiple arguments are true, and false (e.g., logical zero) otherwise) and each data section in FIG. 3 being a doubleword.

The four bit hash may be used as the index into the dictionary used for each particular data section (e.g., doubleword). As shown in FIG. 3, the hash value of the first three data sections (doublewords titled DW0, DW1, and DW2) are all equal to 0xF, while the last data section (doubleword DW3) has a hash value of 0x0. A compression engine (e.g., in a first stage) may determine if there are neighboring data sections (e.g., doublewords) with matching hash values. In this example, DW1 matches DW0, and DW2 matches both DW1 and DW0. For each data section (e.g., doubleword) with hash matches, compression engine may also determine which match is the most recent (e.g., in the order of the data in the block of data). So for DW2, which matches both DW0 and DW1, the most recent match is DW1, for example, with neighbor pointer 0x1 for DW2, which points to DW1 here, e.g., pointing to the most recent neighbor (in the order of the data in the block of data). For example, a data section may match (e.g., the values match) multiple data sections in a plurality of data sections (e.g., a group of data sections). A pointer may point to a most recent or a least recent data section (e.g., in a single group).

A compression engine (e.g., in a second stage) (e.g., see also FIG. 6) may perform a dictionary (e.g., dictionary 400 in FIG. 4) lookup and/or update as well as certain data comparisons (e.g., with a comparator). In one embodiment, a dictionary lookup and update occurs in the same cycle (e.g., the lookup occurring before the update), for example, in order to maintain a throughput of one section (e.g., group) every cycle. In one embodiment, if the dictionary is not updated, the processing of the next section (e.g., group) may not proceed in the next cycle. In certain embodiments, a (e.g., the first) step is for the compression engine to determine if each data section (e.g., doubleword) will result in updating the dictionary. In one embodiment, only the last (for example, in order from the block of data, e.g., memory order) data section (e.g., doubleword) in a group of data sections (e.g., doublewords) with the same hash is to result in a dictionary update, e.g., where it is to effectively overwrite any dictionary updates that are due to be performed for older data sections (e.g., doublewords) with the same hash. In the example in FIG. 3, only DW2 will result in an update, e.g., DW3 will not result in an update because zeroes are handled as a special case.

As shown in the dictionary 400 in FIG. 4, after processing (compressing) this first data group (e.g., four doublewords DW0, DW1, DW2, and DW3), entry 0xF is to be updated with the value (e.g., 0x61616170) from data section (e.g., doubleword) DW3. In one embodiment, a dictionary only includes an index and a (e.g., current) value. Compression engine may perform a dictionary lookup to determine a value (e.g., doubleword) to be compared against a data section (e.g., doubleword). In this example, all dictionary lookup results return 0x00000001 since all entries in the dictionary contain this value, e.g., by default. As noted herein, this is merely an example and a dictionary may be (e.g., initially) populated with other entries.

In one embodiment where a plurality of data sections (e.g., four doublewords) are processed at a time (e.g., simultaneously), the dictionary is (e.g., only) updated after processing (e.g., producing the compressed data) the plurality of data sections (e.g., four doublewords), for example, such that a compression engine is to compare a current data section to a neighboring data section(s) (e.g., doubleword) for comparison, e.g., if the neighboring data section(s) (e.g., doubleword) matches the hash value for the current data section (e.g., doubleword). In the example above, DW1 and DW2 both have neighbor hash matches, therefore the compression engine is to use the neighbor values (DW0 and (DW0 & DW1), respectively) for the comparison with each current data section. For DW0 and DW3, the values from the dictionary (e.g., which both happen to be 0x00000001 in this example) are to be used for this comparison as they do not have a matching (e.g., older) neighbor, for example, DW0 has no older neighbor as it is the first section of this group of data sections (e.g., doublewords DW0, DW1, DW2, and DW3). These values to compare may then be compared against the current data section (e.g., doubleword) to determine if any matches exist. In FIG. 3, DW0 did not match the comparison value ("Word to Compare" in FIG. 3) and is not zero, so it is therefore designated as a literal by the compression engine. In FIG. 3, DW1 completely matches the comparison value and so it is designated as a full match (e.g., to its neighbor with the same hash value) by the compression engine. In FIG. 3, assuming a partial match includes bit positions [32-12], DW2 matches the upper section of bits and so it is to be designated as a partial match (e.g., to its neighbor with the same hash value) by the compression engine. In FIG. 3, DW3 is the special case of having a zero value (e.g., all bits being zero) so it designated as a zero value by the compression engine. In one embodiment of FIG. 3, a zero value is a tag of 00, a full match to an entry in a dictionary is a tag of 11, a partial match to an entry in a dictionary is a tag of 01, and a literal is a tag of 10. In certain embodiments, the number of tag entries (e.g., two bit entries) in a tag (e.g., of a tag field) of a group of compressed data indicates how many sections of data are in the group. For example, four tag entries (e.g., 8 bits total for the single tag field in an example with two bit tags for each section) in a tag indicate four sections of data are in that group of compressed data sections. In certain embodiments, a compressed group of data does not include a header field, e.g., a compressed data group does not include a header field but does include a tag field.

A compression engine (e.g., in a third stage) (e.g., see also FIG. 6) may encode the compressed bits. Compression engine may encode (e.g., pack) the tag (e.g., 2 bits per word) which results in 0x1E (binary 00011110). Note that the choice of encoding here is from youngest data section (e.g., doubleword DW3) to the oldest data section (e.g., doubleword DW0), but other encodings may be used (e.g., from oldest to youngest data section (e.g., doubleword)). Compression engine may encode (e.g., pack) any literal data sections (e.g., doublewords). In this example, DW0 is a literal with the value of 0x61616161. Compression engine may encode the index (e.g., position) bits (which in this example are equal to the hash value) of all words with matches, full or partial. In this example, DW1 is a full match and DW2 is a partial match, both with an index of 0xF. Compression engine may encode (e.g., pack in the same order as the tag and index fields) the non-matching (e.g., low) bits for all partial matches. In this example, DW3 is a partial match with non-matching bits (12 least significant bits 000101110000) of 0x170. The resulting compressed data output for four doublewords DW0, DW1, DW2, and DW3 may thus be 0x170FF616161611E. Different orders of the fields in this compressed data section may be used, e.g., compressed data output for four doublewords DW0, DW1, DW2, and DW3 is 0xB461616161FF170 according to the order of the format in FIG. 2.

Figure 5:
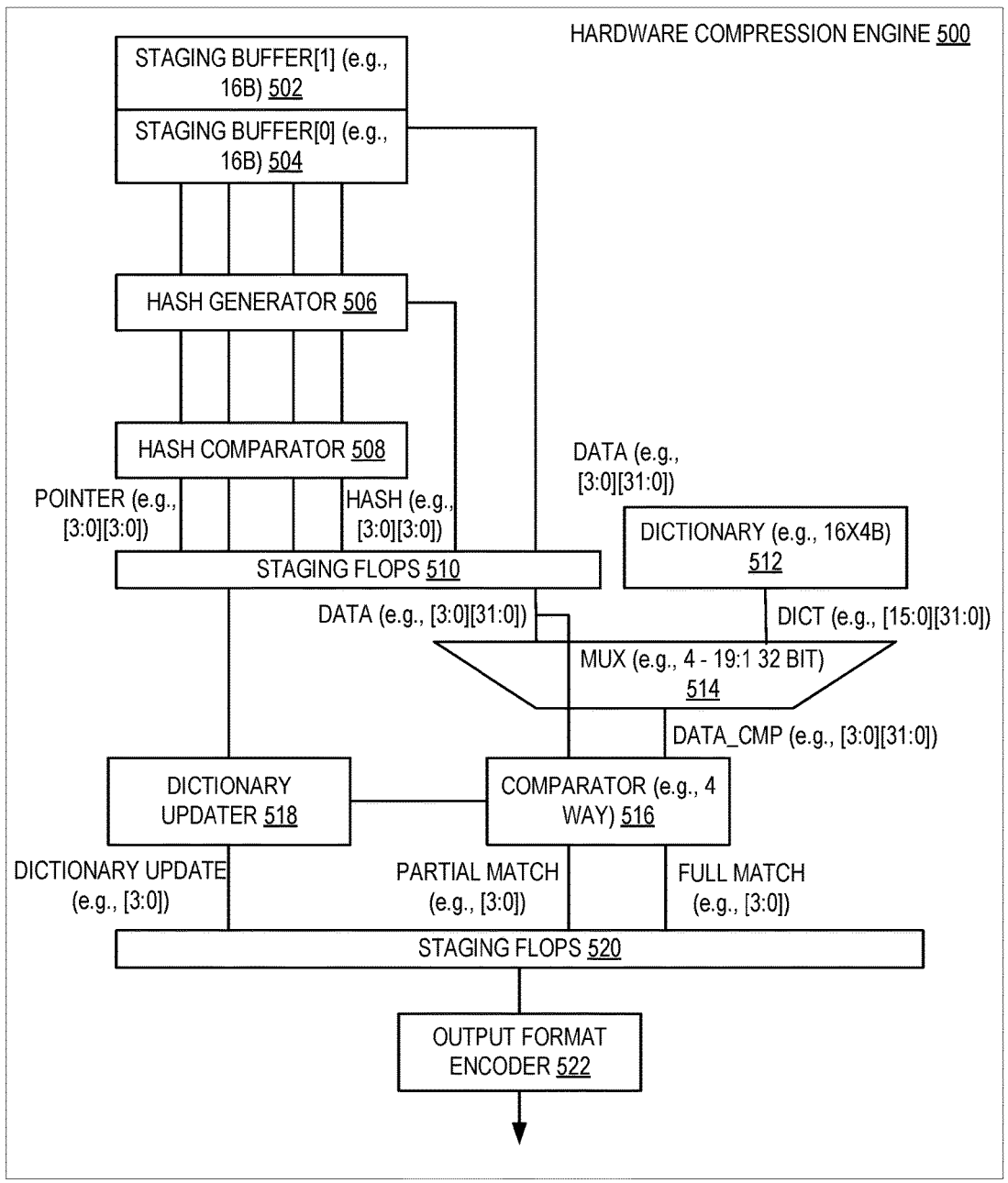
FIG. 5 illustrates a hardware compression engine according to embodiments of the disclosure.

FIG. 5 illustrates a hardware compression engine 500 according to embodiments of the disclosure. In one embodiment, hardware compression engine 500 is compression engine 102 in FIG. 1. In one embodiment, uncompressed data (e.g., a group of data sections) is fed (e.g., by hardware compression engine) into (for example, one or more staging buffers (e.g., staging buffer[1] 502 and staging buffer[0] 504)) and processed for compression by hardware compression engine (e.g., in 16 byte (16B) groups). Although two staging buffers are depicted, one, zero, or any number of staging buffers may be used in certain embodiments. In one embodiment, staging buffer has a data width the same or greater than a total size of the data sections to be compressed in a group. In one embodiment, hardware compression engine 500 is to input the data for compression on request by a requestor (e.g., processor).

Hash generator 506 (e.g., circuit) may generate a hash (e.g., according to a hash function), for example, a hash for each data section (e.g., doubleword). In one embodiment, the hash value generation occurs in parallel for the sections (e.g., doublewords). Hash comparator 508 may compare the hashes against each other to determine if any of the hashes match (e.g., if any of the (older) neighbor hashes match).

In one embodiment, this information (e.g., neighbor pointer and/or hash matches) may be staged (e.g., stored) in staging flops 510 for further use, e.g., in the next stage. Compression engine 500 may perform dictionary lookups in dictionary 512 (e.g., initially populated as in dictionary 400 in FIG. 4). Multiplexer (mux) 514 may output one of data (e.g., one for each data section) that is input into the hardware compression engine 500, and a dictionary entry (e.g., index and value). In one embodiment, a plurality of parallel dictionary lookups are performed (e.g., one for each data section (e.g., doubleword)). In one embodiment, e.g., based on the hashes and neighbor matches, the resulting dictionary value (e.g., doubleword) is compared by comparator 516 against the data section (e.g., doubleword) being evaluated for full and/or partial matches. The results of the comparison may be staged (e.g., stored) in staging flops 520 for future use, e.g., for processing in the next stage. The two inputs to a comparator (e.g., comparator 516 in FIG. 5 or comparator 616 in FIG. 6) are (1) are the output of a mux (e.g., mux 514 in FIG. 5 or mux 614 in FIG. 6, as discussed below) and (2) the input data section (e.g., doubleword) that is being processed. In one embodiment, the comparator output is the indicator of a full match, partial match, or no match (e.g., according to the tag values in FIG. 3).

In one embodiment, one round of compression occurs in a single cycle (e.g., a single cycle having multiple phases). In one embodiment, e.g., based on the hash comparison between neighbors (e.g., the current data section and the previous data sections), the proper dictionary updates are determined by dictionary updater 518, e.g., in the same cycle. In certain embodiments, this may allow a dictionary to be fully updated and ready for use in the next cycle. The results (e.g., from staging flops 520) may be used (e.g., by output format encoder 522) to format the compressed stream, e.g., as discussed above in reference to FIGS. 3 and 4. In one embodiment, a mux (e.g., mux 514 in FIG. 5 or mux 614 in FIG. 6) is a two stage mux, where the first stage on the left input selects which input data section corresponds to the neighbor data section (e.g., doubleword). The neighbor pointer is used for this first stage. The right side of the mux also has a first stage which selects which data section (e.g., doubleword) out of the (e.g., 16 entry) dictionary to use. The hash here is used to select which dictionary entry (e.g., doubleword) to use. The second stage of the mux allows the selection between the neighbor data sections (e.g., the output of 1$^{st}$ stage) and the dictionary output (right side). In one embodiment, the mux uses the "Neighbor Hash Match" field in FIG. 3 to select whether to use the neighbor word (left) or dictionary word (right).

Figure 6:
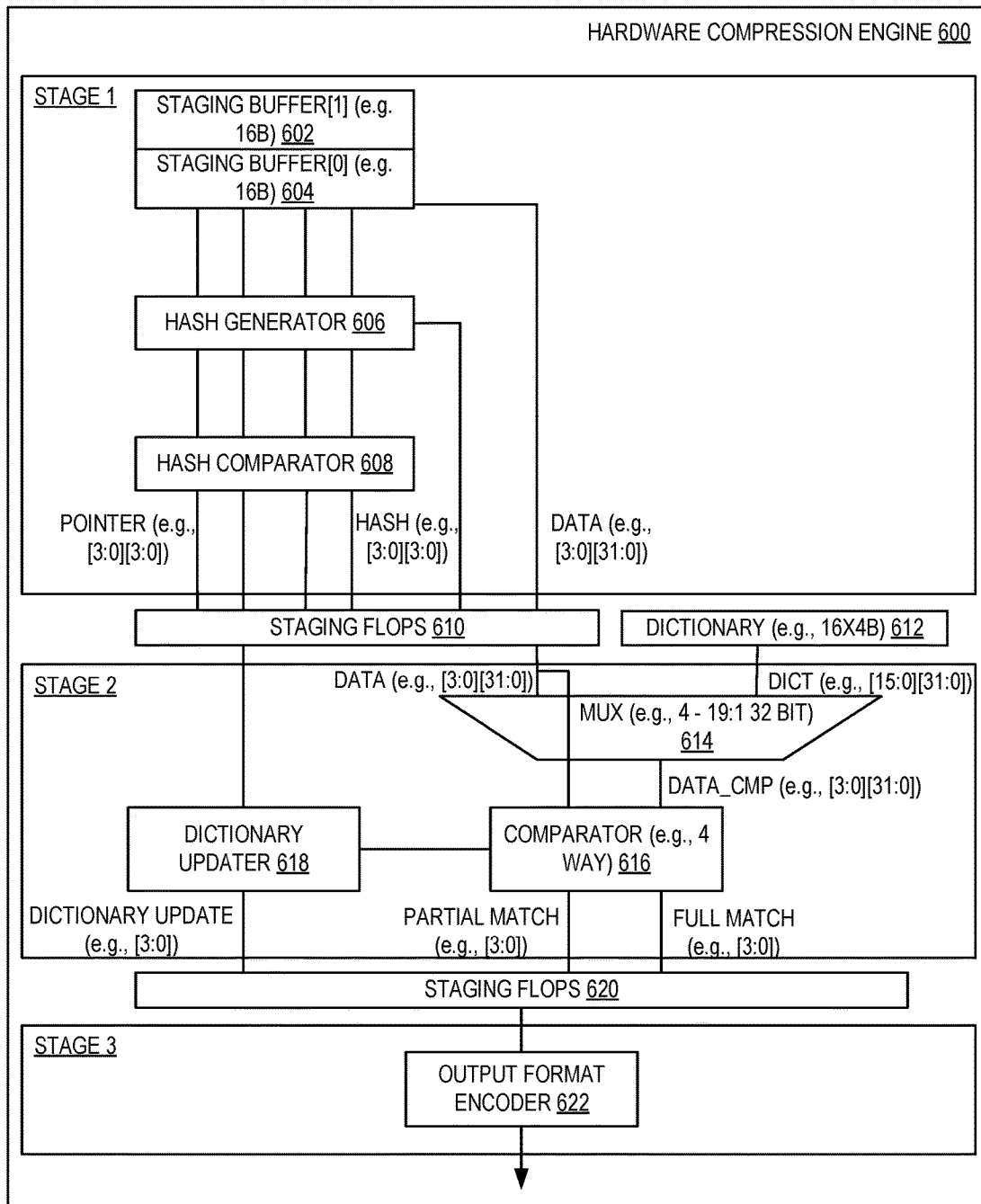
FIG. 6 illustrates another hardware compression engine according to embodiments of the disclosure.

FIG. 6 illustrates a hardware compression engine 600 according to embodiments of the disclosure. In certain embodiments, stages 1, 2, and 3 correspond to stage 1, 2, and 3 in FIG. 3. In one embodiment, hardware compression engine 600 is compression engine 102 in FIG. 1. In one embodiment, uncompressed data (e.g., a group of data sections) is fed (e.g., by hardware compression engine) into (for example, one or more staging buffers (e.g., staging buffer[1] 602 and staging buffer[0] 604) and processed for compression by hardware compression engine (e.g., in 16B groups). Although two staging buffers are depicted, one, zero, or any number of staging buffers may be used in certain embodiments. In one embodiment, staging buffer has a data width the same or greater than a total size of the data sections to be compressed in a group. In one embodiment, hardware compression engine 600 is to input the data for compression on request by a requestor (e.g., processor).

Hash generator 606 (e.g., circuit) may generate a hash (e.g., according to a hash function), for example, a hash for each data section (e.g., doubleword). In one embodiment, the hash value generation occurs in parallel for the sections (e.g., doublewords). Hash comparator 608 may compare the hashes against each other to determine if any of the hashes match (e.g., if any of the (older) neighbor hashes match).

In one embodiment, this information (e.g., neighbor pointer and/or hash matches) may be staged (e.g., stored) in staging flips 610 for future use, e.g., in the next stage. Compression engine 600 may perform dictionary lookups in dictionary 612 (e.g., dictionary 400 in FIG. 4). Mux 614 may output one of the data (e.g., each data section (e.g., doubleword) input into the hardware compression engine 600 and the dictionary entry (e.g., index and value). In one embodiment, a plurality of parallel dictionary lookups are performed (e.g., one for each data section (e.g., doubleword)). In one embodiment, e.g., based on the hashes and neighbor matches, the resulting dictionary value (e.g., doubleword) is compared by comparator 616 against the data section (e.g., doubleword) being evaluated for full or partial matches. The results of the comparison may be staged (e.g., stored) in staging flops 620 for future use, e.g., for processing in the next stage. In one embodiment, e.g., based on the hash comparison between neighbors (e.g., the current data section and the immediately previous data section), the proper dictionary updates are determined by dictionary updater 618, e.g., in the same cycle. In certain embodiments, this may allow a dictionary to be fully updated and ready for use in the next cycle. The results may then be used (e.g., by output format encoder 622) to format the compressed stream, e.g., as discussed above in reference to FIGS. 3 and 4.

Figure 7:
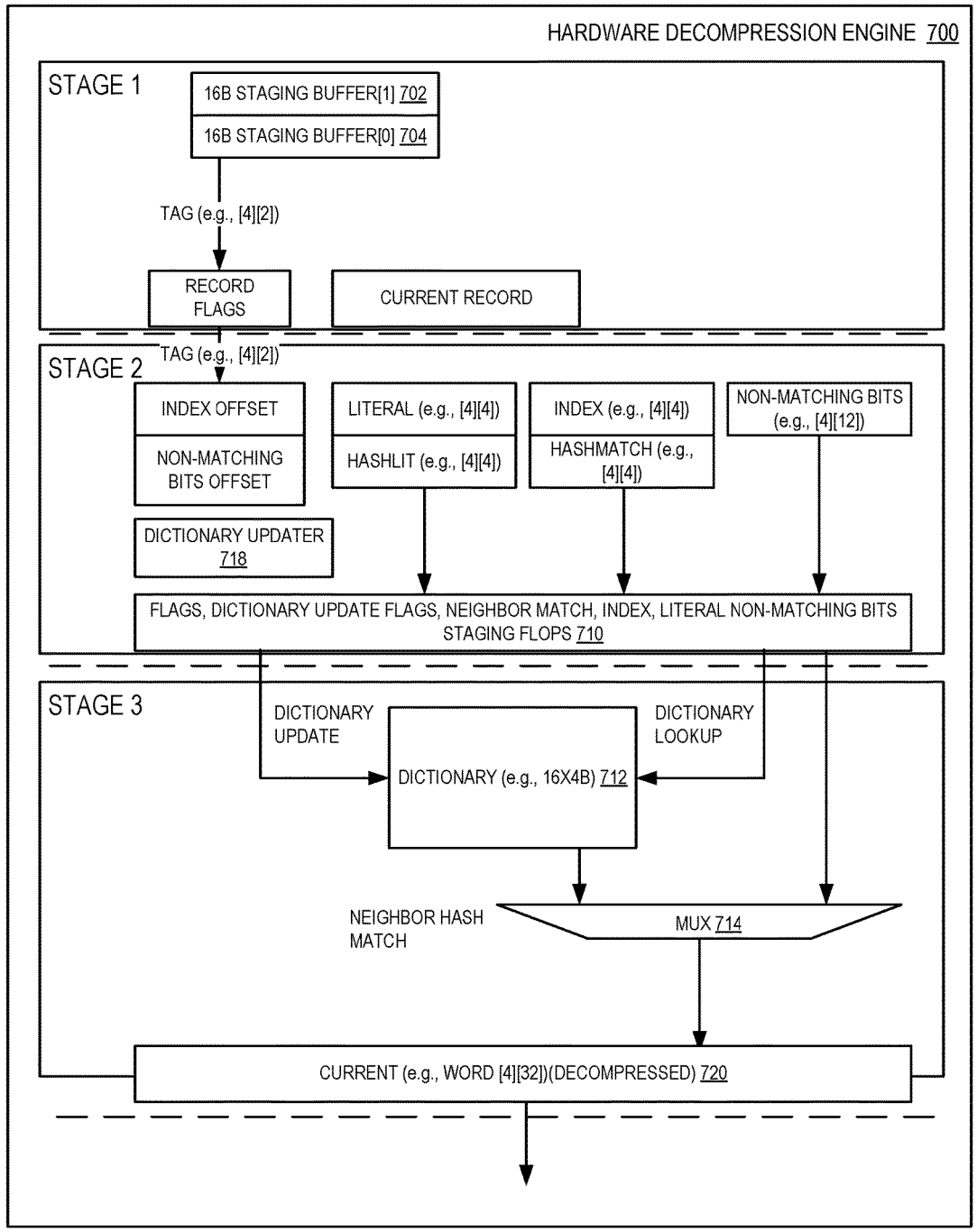
FIG. 7 illustrates a hardware decompression engine according to embodiments of the disclosure.

FIG. 7 illustrates a hardware decompression engine 700 according to embodiments of the disclosure. In one embodiment, hardware decompression engine 700 is decompression engine 104 in FIG. 1. In one embodiment, compressed data (e.g., for a group of data sections) is fed (e.g., by hardware decompression engine) into (for example, one or more staging buffers, e.g., staging buffer[1] 702 and staging buffer[0] 704) and processed for decompression by hardware decompression engine (e.g., in 16B groups of uncompressed data). In one embodiment, compressed data for one group is fed into the engine (e.g., at 16B every cycle) and buffered in an input buffer, e.g., one of the (e.g., 16B) staging buffers. The size of the compressed data may be determined, for example, based on the (e.g., 4) sets of tag bits. In certain embodiments, if the number of valid bytes in the buffers is more than or equal to the compressed data group (e.g., record) size, the compressed data group (e.g., record) is deemed valid and processing starts. In addition to decoding the tags, the offset into the compressed data, where the index (e.g., position) bits and/or the non-matching bits start, may be computed (e.g., based on the tag values for each section of the group of compressed data). The next start pointer for a group of compressed data may be calculated, e.g., based on compressed data group (e.g., record) size (for example, which may vary between groups, e.g., based on how many of each type of match, zero, or literals are included in a group) and current pointer in order to start the processing of the next record, e.g., in the next cycle. The tag decode information and position and non-matching bits offsets may be staged accordingly, for example, in registers or other storage (e.g., as shown in stage 2), e.g., where the first number indicates the number of data sections and the second number indicates the number of bits. For example, Non- Matching Bits[4][12] is an example where there are four possible partial matches that may be processed and each has twelve bits of data.

In the first stage of the depicted hardware decompression engine, literal bits, hashes, indexes (e.g., position bits), and non-matching bits are extracted from the compressed data. For example, based (e.g., only) on the hashes of the literal bytes and the index bits, the proper dictionary updates may be determined in stage one (e.g., shown within stage two in FIG. 7) by dictionary updater 718. In one embodiment, dictionary updater 718 is to update an entry (e.g., via an index having a value of a hash) for a (e.g., each) literal in a compressed data group (e.g., record). In one embodiment, the compressed data to be decompressed is analyzed in the same order that it was compressed. For example, in reference to FIG. 3, the literal 0x61616170 for DW2 is detected and the dictionary (e.g., index 0xF in dictionary 400 in FIG. 4) is updated (or scheduled to be updated) with that literal value. This information may be flopped into stage 3 for processing, for example, from staging flop 710, e.g., register. In one embodiment, a full match or partial match (e.g., from a tag) indicates to the hardware decompression engine that the decompressed value for a section of data being decompressed is to be sourced from (i) all or a portion of a literal value from an older section of data (e.g., literal) of the group of (e.g., neighbor) data sections (e.g., if that literal's hash is the same hash as the full match's hash or partial match's hash) or (ii) all or a portion of a dictionary entry having an index (e.g., hash) that matches the index (e.g., hash) for the section of data (e.g., if the hash for the section of data does not match the hash of any of the older data sections in the group). For example, DW3 is older than DW2, DW1, and DW0; DW2 is older than DW1 and DW0; DW1 is older than DW0; and DW0 is not older than any of the other words in an embodiment of FIG. 3. For example, as a dictionary update may occur after the compression and/or decompression of a single set of a plurality of sections of data (e.g., a group of data sections), the older (e.g., in memory order) sections of data may be checked for a matching index (e.g., hash) in an embodiment where their dictionary value would have been updated (e.g., in the next cycle with a different value) but for a later (e.g., most recent) section of data having the same index (e.g., hash).

In stage 3, in one embodiment a dictionary lookup may be performed into dictionary 712 by the hardware decompression engine 700. In one embodiment, for full or partial matches, the proper value (e.g., doubleword) is extracted from the dictionary lookup or neighboring data section (e.g., doubleword) based on neighbor hash matches. Dictionary updates may also be performed in the same cycle as the lookup to ensure dictionary 712 is up to date and ready for use in the next cycle. In one embodiment, depending on the tags, the decompressed data sections (e.g., doublewords) are formed, e.g., either with zero value (constant), literal word, dictionary lookup value (e.g., doubleword), or a combination of the dictionary lookup value (e.g., doubleword) and the non-matching (e.g., low) bits. In one embodiment, mux 714 is to output the decompressed data (e.g., without a tag). The decompressed data sections (e.g., doublewords) may be flopped for output in stage 3, for example, in staging flop 720, e.g., register.

In one embodiment, only the last (for example, in order from the block of data, e.g., memory order) data section (e.g., doubleword) in a group of data sections (e.g., doublewords) with the same hash is to result in a dictionary update during decompression (for example, the same update that was made during a compression operation for that group of data sections), e.g., where the hardware engine is to effectively overwrite any dictionary updates that are due to be performed for older data sections (e.g., doublewords). In the example in FIG. 3, only DW2 will result in an update, e.g., DW3 will not result in an update because zeroes are handled as a special case. As shown in the dictionary 400 in FIG. 4, after processing (decompressing) this first data section (e.g., four doublewords DW0, DW1, DW2, and DW3), entry 0xF is to be updated with the value (0x61616170) from data section (e.g., doubleword) DW3.

Figure 8:
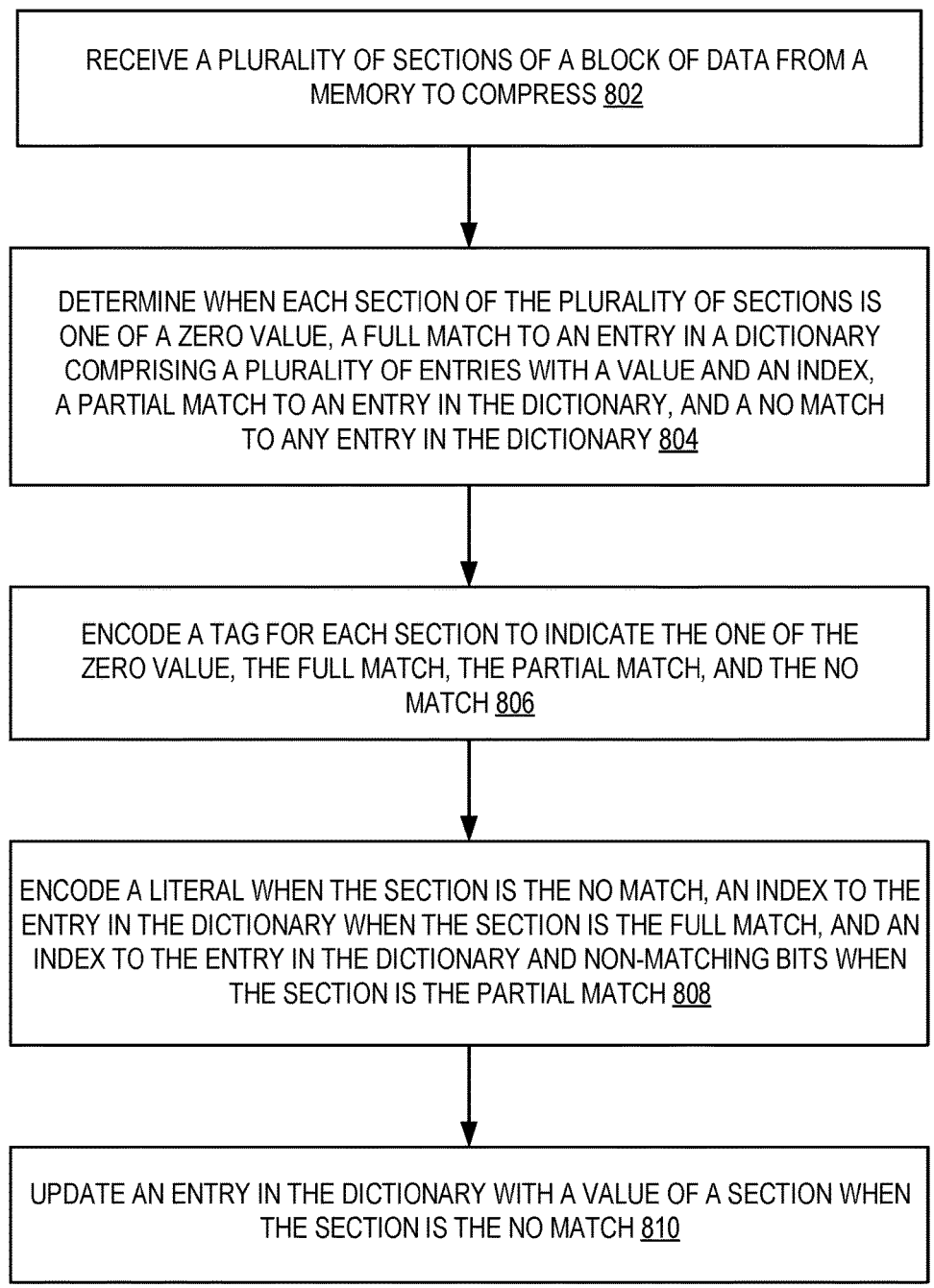
FIG. 8 illustrates a flow diagram of a method for memory compression and decompression according to embodiments of the disclosure.

FIG. 8 illustrates a flow diagram of a method for memory compression and decompression according to embodiments of the disclosure. Flow diagram 800 includes receiving a plurality of sections of a block of data from a memory to compress, at 802; determining when each section of the plurality of sections is one of a zero value, a full match to an entry in a dictionary comprising a plurality of entries with a value and an index, a partial match to an entry in the dictionary, and a no match to any entry in the dictionary, at 804; encoding a tag for each section to indicate the one of the zero value, the full match, the partial match, and the no match, at 806; encoding a literal when the section is the no match, an index to the entry in the dictionary when the section is the full match, and an index to the entry in the dictionary and non-matching bits when the section is the partial match, at 808; and updating an entry in the dictionary with a value of a section when the section is the no match, at 810.

In certain embodiments, e.g., for non-volatile (e.g., transistor-less) phase-change memory (PCM), a compression engine and/or decompression engine increases the effective bandwidth through compression, for example, where power consumption may otherwise limit bandwidth. Certain embodiments of a compression engine and/or decompression engine herein reduce bus activity which reduces power consumption, e.g., effectively increasing bandwidth capacity. Certain embodiments of a compression engine and/or decompression engine herein improve write endurance characteristics with reduced write count. Certain embodiments of a compression engine and/or decompression engine herein provide for a high throughput for compress/decompress operations (e.g., at least 16 Bytes per cycle), operate on small block sizes (for example, 256 Bytes (e.g., a cache line size)), achieve better than a 45% compression ratio (e.g., compressed data size divided by the original data size) on a substantial fraction (e.g., greater than 50%) of data blocks in memory transactions (e.g. writes to far memory in a two level memory (2LM) configuration), or any combination thereof. Certain embodiments of a compression engine and/or decompression engine herein have a low design complexity, for example, a reasonable read latency impact (e.g., less than 4 cycles), a reasonable area impact (e.g., less than 200 thousand (200K) gates), a reasonable power foot-print, or any combination thereof. In one embodiment, the smaller the read latency impact, the higher the likelihood that a compression engine and/or decompression engine is to turn a negative impact to a positive impact (e.g. assuming the I/O to a near memory sub-system has a higher bandwidth than available in a far memory (e.g., PCM) sub-system, for example, where the compressed data is stored, then as long as the compression engine and/or decompression engine does not add multiple cycles in the decompression path in the far memory sub-system, there will be a net gain in access time. In one embodiment, the data being compressed and/or decompressed are memory transactions. In one embodiment, the memory transactions include accessing a server. In one embodiment, a block of data is 256 Bytes and a section of the block data is smaller (e.g., is a doubleword). Certain embodiments of a compression engine and/or decompression engine herein perform compression and/or decompression, respectively, on less than an entire block of data (e.g., less than 10 or less than 5 sections of data). Certain embodiments of a compression engine and/or decompression engine herein utilize a single pass (e.g., not a two pass) processing to compress a block of data or a group of sections of a block of data. Certain embodiments of a compression engine and/or decompression engine herein do not completely buffer an entire block of data during compression and/or decompression, e.g., to avoid a longer latency through the block.

In certain embodiments, the compression engine is located where an encryption is happening. In one embodiment, an address-indirection-table (AIT) includes the appropriate information on compressed lines (e.g., from compressed data format 200 in FIG. 2). In one embodiment, a compression engine is inserted before an encryption engine (e.g., scrambler) along a write data path and/or a decompression engine is inserted after a decryption engine (e.g., scrambler) along a read data path. In one embodiment, two compression flag bits are added to AIT (e.g., for compression status to be available for channel controller to send corresponding read commands), for example, a compression status flag, e.g., to indicate compression status (compressed data or uncompressed data), and a compressed line position (CLP) flag to indicate which portion of a cache line (e.g., which half) is used when compressed. For example, a CLP flag may indicate which portion (e.g., half) of a cache line is to be accessed (e.g., for storage or loading), may toggle between upper and lower half in sequential compressed writes, and/or increment write counts (e.g., only) when uncompressed or CLP bit is low.

In one embodiment, compression flags are part of command sent to the scheduler. In one embodiment, a scheduler issues memory transactions based on compression flags. In one embodiment, one bit is used for compression and an optional second bit is to enable write count reduction. Certain embodiments provide for improved write durability, e.g., by reducing writes.

Certain embodiments herein provide for bandwidth savings. Certain embodiments herein provide for wear-leveling endurance. Certain embodiments herein may provide a compression ratio of 66% (e.g., greater than 65%). Certain embodiments herein (e.g., the hardware engines in the Figures) are fully synthesizable and/or relatively compact (e.g., with less than 50 thousand (50 k) gates each). In one embodiment, the read latency impact of embodiments of this disclosure is three cycles. In one embodiment, the clock frequency is 2 gigahertz (2 GHz).

In one embodiment, a memory controller includes a connection to a memory; and a hardware compression engine to receive a plurality of sections of a block of data from the memory to compress, determine when each section of the plurality of sections is one of a zero value, a full match to an entry in a dictionary comprising a plurality of entries with a value and an index, a partial match to an entry in the dictionary, and a no match to any entry in the dictionary, encode a tag for each section to indicate the one of the zero value, the full match, the partial match, and the no match, encode a literal when the section is the no match, an index to the entry in the dictionary when the section is the full match, and an index to the entry in the dictionary and non-matching bits when the section is the partial match, and update an entry in the dictionary with a value of a section when the section is the no match. The tag may be an only output from the hardware compression engine for the zero value. Tags for the plurality of sections may be output from the hardware compression engine in a single field. Literals for the plurality of sections may be output from the hardware compression engine in a single field, indexes for the plurality of sections may be output from the hardware compression engine in a single field, and non-matching bits for the plurality of sections may be output from the hardware compression engine in a single field. Literals for the plurality of sections may be output from the hardware compression engine in a single field in a same order as in the block of data. The hardware compression engine may generate a hash for each of the plurality of sections of a block of data to use as an index in the dictionary. The hardware compression engine may, e.g., when indices for multiple of the plurality of sections are the same, update the entry in the dictionary with the value of the section that is most recent in a same order as in the block of data. The hardware compression engine may initially populate the dictionary with a plurality of most common values of sections of the block of data other than zero values.

In another embodiment, a method includes receiving a plurality of sections of a block of data from a memory to compress with a hardware compression engine; determining with the hardware compression engine when each section of the plurality of sections is one of a zero value, a full match to an entry in a dictionary comprising a plurality of entries with a value and an index, a partial match to an entry in the dictionary, and a no match to any entry in the dictionary; encoding with the hardware compression engine a tag for each section to indicate the one of the zero value, the full match, the partial match, and the no match; encoding with the hardware compression engine a literal when the section is the no match, an index to the entry in the dictionary when the section is the full match, and an index to the entry in the dictionary and non-matching bits when the section is the partial match; and updating with the hardware compression engine an entry in the dictionary with a value of a section when the section is the no match. The method may include only outputting the tag for the zero value. The method may include outputting tags for the plurality of sections in a single field. The method may include outputting literals for the plurality of sections in a single field, indexes for the plurality of sections in a single field, and non-matching bits for the plurality of sections in a single field. The method may include outputting literals for the plurality of sections in a single field in a same order as in the block of data. The method may include generating a hash for each of the plurality of sections of a block of data to use as an index in the dictionary. The method may include, e.g., when indices for multiple of the plurality of sections are the same, updating the entry in the dictionary with the value of the section that is most recent in a same order as in the block of data. The method may include initially populating the dictionary with a plurality of most common values of sections of the block of data other than zero values.

In yet another embodiment, a non-transitory machine readable medium stores code that when executed by a machine causes the machine to perform a method including receiving a plurality of sections of a block of data from a memory to compress with a hardware compression engine; determining with the hardware compression engine when each section of the plurality of sections is one of a zero value, a full match to an entry in a dictionary comprising a plurality of entries with a value and an index, a partial match to an entry in the dictionary, and a no match to any entry in the dictionary; encoding with the hardware compression engine a tag for each section to indicate the one of the zero value, the full match, the partial match, and the no match; encoding with the hardware compression engine a literal when the section is the no match, an index to the entry in the dictionary when the section is the full match, and an index to the entry in the dictionary and non-matching bits when the section is the partial match; and updating with the hardware compression engine an entry in the dictionary with a value of a section when the section is the no match. The method may include only outputting the tag for the zero value. The method may include outputting tags for the plurality of sections in a single field. The method may include outputting literals for the plurality of sections in a single field, indexes for the plurality of sections in a single field, and non-matching bits for the plurality of sections in a single field. The method may include outputting literals for the plurality of sections in a single field in a same order as in the block of data. The method may include generating a hash for each of the plurality of sections of a block of data to use as an index in the dictionary. The method may include, e.g., when indices for multiple of the plurality of sections are the same, updating the entry in the dictionary with the value of the section that is most recent in a same order as in the block of data. The method may include initially populating the dictionary with a plurality of most common values of sections of the block of data other than zero values.

In one embodiment, a hardware compression engine includes means to receive a plurality of sections of a block of data from the memory to compress, means to determine when each section of the plurality of sections is one of a zero value, a full match to an entry in a dictionary comprising a plurality of entries with a value and an index, a partial match to an entry in the dictionary, and a no match to any entry in the dictionary, means to encode a tag for each section to indicate the one of the zero value, the full match, the partial match, and the no match, means to encode a literal when the section is the no match, an index to the entry in the dictionary when the section is the full match, and an index to the entry in the dictionary and non-matching bits when the section is the partial match, and means to update an entry in the dictionary with a value of a section when the section is the no match.

In yet another embodiment, an apparatus comprises a data storage device that stores code that when executed by a hardware processor causes the hardware processor to perform any method disclosed herein. An apparatus may be as described in the detailed description. A method may be as described in the detailed description.

An instruction set may include one or more instruction formats. A given instruction format may define various fields (e.g., number of bits, location of bits) to specify, among other things, the operation to be performed (e.g., opcode) and the operand(s) on which that operation is to be performed and/or other data field(s) (e.g., mask). Some instruction formats are further broken down though the definition of instruction templates (or subformats). For example, the instruction templates of a given instruction format may be defined to have different subsets of the instruction format's fields (the included fields are typically in the same order, but at least some have different bit positions because there are less fields included) and/or defined to have a given field interpreted differently. Thus, each instruction of an ISA is expressed using a given instruction format (and, if defined, in a given one of the instruction templates of that instruction format) and includes fields for specifying the operation and the operands. For example, an exemplary ADD instruction has a specific opcode and an instruction format that includes an opcode field to specify that opcode and operand fields to select operands (source1/destination and source2); and an occurrence of this ADD instruction in an instruction stream will have specific contents in the operand fields that select specific operands. A set of single instruction, multiple data (SIMD) extensions referred to as the Advanced Vector Extensions (AVX) (AVX1 and AVX2) and using the Vector Extensions (VEX) coding scheme has been released and/or published (e.g., see Intel® 64 and IA-32 Architectures Software Developer's Manual, December 2015; and see Intel® Architecture Instruction Set Extensions Programming Reference, February 2016).

Exemplary Core Architectures, Processors, and Computer Architectures

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a central processing unit (CPU) including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

Exemplary Core Architectures

In-Order and Out-of-Order Core Block Diagram

FIG. 9A is a block diagram illustrating both an exemplary in-order pipeline and an exemplary register renaming, out-of-order issue/execution pipeline according to embodiments of the disclosure. FIG. 9B is a block diagram illustrating both an exemplary embodiment of an in-order architecture core and an exemplary register renaming, out-of-order issue/execution architecture core to be included in a processor according to embodiments of the disclosure. The solid lined boxes in FIGS. 9A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 9A, a processor pipeline 900 includes a fetch stage 902, a length decoding stage 904, a decode stage 906, an allocation stage 908, a renaming stage 910, a schedule (also known as a dispatch or issue) stage 912, a register read/memory read stage 914, an execute stage 916, a write back/memory write stage 918, an exception handling stage 922, and a commit stage 924.

FIG. 9B shows processor core 990 including a front end unit 930 coupled to an execution engine unit 950, and both are coupled to a memory unit 970. The core 990 may be a reduced instruction set computing (RISC) core, a complex instruction set computing (CISC) core, a very long instruction word (VLIW) core, or a hybrid or alternative core type. As yet another option, the core 990 may be a special-purpose core, such as, for example, a network or communication core, compression engine, coprocessor core, general purpose computing graphics processing unit (GPGPU) core, graphics core, or the like.

The front end unit 930 includes a branch prediction unit 932 coupled to an instruction cache unit 934, which is coupled to an instruction translation lookaside buffer (TLB) unit 936, which is coupled to an instruction fetch unit 938, which is coupled to a decode unit 940. The decode unit 940 (or decoder or decoder unit) may decode instructions (e.g., macro-instructions), and generate as an output one or more micro-operations, micro-code entry points, micro-instructions, other instructions, or other control signals, which are decoded from, or which otherwise reflect, or are derived from, the original instructions. The decode unit 940 may be implemented using various different mechanisms. Examples of suitable mechanisms include, but are not limited to, look-up tables, hardware implementations, programmable logic arrays (PLAs), microcode read only memories (ROMs), etc. In one embodiment, the core 990 includes a microcode ROM or other medium that stores microcode for certain macroinstructions (e.g., in decode unit 940 or otherwise within the front end unit 930). The decode unit 940 is coupled to a rename/allocator unit 952 in the execution engine unit 950.

The execution engine unit 950 includes the rename/allocator unit 952 coupled to a retirement unit 954 and a set of one or more scheduler unit(s) 956. The scheduler unit(s) 956 represents any number of different schedulers, including reservation stations, central instruction window, etc. The scheduler unit(s) 956 is coupled to the physical register file(s) unit(s) 958. Each of the physical register file(s) units 958 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 958 comprises a vector registers unit, a write mask registers unit, and a scalar registers unit. These register units may provide architectural vector registers, vector mask registers, and general purpose registers. The physical register file(s) unit(s) 958 is overlapped by the retirement unit 954 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 954 and the physical register file(s) unit(s) 958 are coupled to the execution cluster(s) 960. The execution cluster(s) 960 includes a set of one or more execution units 962 and a set of one or more memory access units 964. The execution units 962 may perform various operations (e.g., shifts, addition, subtraction, multiplication) on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 956, physical register file(s) unit(s) 958, and execution cluster(s) 960 are shown as being possibly plural because certain embodiments create separate pipelines for certain types of data/operations (e.g., a scalar integer pipeline, a scalar floating point/packed integer/packed floating point/ vector integer/vector floating point pipeline, and/or a memory access pipeline that each have their own scheduler unit, physical register file(s) unit, and/or execution cluster and in the case of a separate memory access pipeline, certain embodiments are implemented in which only the execution cluster of this pipeline has the memory access unit(s) 964). It should also be understood that where separate pipelines are used, one or more of these pipelines may be out-of-order issue/execution and the rest in-order.

The set of memory access units 964 is coupled to the memory unit 970, which includes a data TLB unit 972 coupled to a data cache unit 974 coupled to a level 2 (L2) cache unit 976. In one exemplary embodiment, the memory access units 964 may include a load unit, a store address unit, and a store data unit, each of which is coupled to the data TLB unit 972 in the memory unit 970. The instruction cache unit 934 is further coupled to a level 2 (L2) cache unit 976 in the memory unit 970. The L2 cache unit 976 is coupled to one or more other levels of cache and eventually to a main memory.

By way of example, the exemplary register renaming, out-of-order issue/execution core architecture may implement the pipeline 900 as follows: 1) the instruction fetch unit 938 performs the fetch and length decoding stages 902 and 904; 2) the decode unit 940 performs the decode stage 906; 3) the rename/allocator unit 952 performs the allocation stage 908 and renaming stage 910; 4) the scheduler unit(s) 956 performs the schedule stage 912; 5) the physical register file(s) unit(s) 958 and the memory unit 970 perform the register read/memory read stage 914; the execution cluster 960 perform the execute stage 916; 6) the memory unit 970 and the physical register file(s) unit(s) 958 perform the write back/memory write stage 918; 7) various units may be involved in the exception handling stage 922; and 8) the retirement unit 954 and the physical register file(s) unit(s) 958 perform the commit stage 924.

The core 990 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 990 includes logic to support a packed data instruction set extension (e.g., AVX1, AVX2), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 934/974 and a shared L2 cache unit 976, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Specific Exemplary In-Order Core Architecture

Figure 10B:
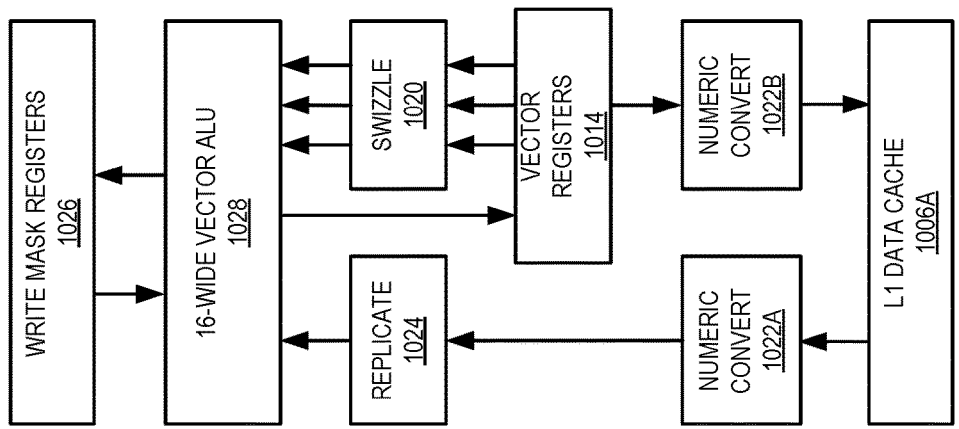
FIG. 10B is an expanded view of part of the processor core in FIG. 10A according to embodiments of the disclosure.
Figure 10A:
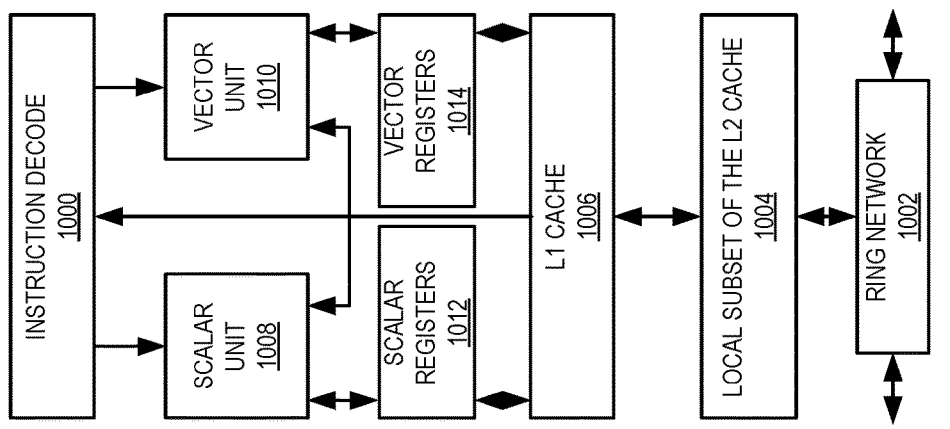
FIG. 10A is a block diagram of a single processor core, along with its connection to the on-die interconnect network and with its local subset of the Level 2 (L2) cache, according to embodiments of the disclosure.

FIGS. 10A-B illustrate a block diagram of a more specific exemplary in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 10A is a block diagram of a single processor core, along with its connection to the on-die interconnect (e.g., ring) network 1002 and with its local subset of the Level 2 (L2) cache 1004, according to embodiments of the disclosure. In one embodiment, an instruction decode unit 1000 supports the x86 instruction set with a packed data instruction set extension. An L1 cache 1006 allows low-latency accesses to cache memory into the scalar and vector units. While in one embodiment (to simplify the design), a scalar unit 1008 and a vector unit 1010 use separate register sets (respectively, scalar registers 1012 and vector registers 1014) and data transferred between them is written to memory and then read back in from a level 1 (L1) cache 1006, alternative embodiments of the disclosure may use a different approach (e.g., use a single register set or include a communication path that allows data to be transferred between the two register files without being written and read back).

The local subset of the L2 cache 1004 is part of a global L2 cache that is divided into separate local subsets, one per processor core. Each processor core has a direct access path to its own local subset of the L2 cache 1004. Data read by a processor core is stored in its L2 cache subset 1004 and can be accessed quickly, in parallel with other processor cores accessing their own local L2 cache subsets. Data written by a processor core is stored in its own L2 cache subset 1004 and is flushed from other subsets, if necessary. The ring network ensures coherency for shared data. The ring network is bi-directional to allow agents such as processor cores, L2 caches and other logic blocks to communicate with each other within the chip. Each ring data-path is 1012-bits wide per direction.

FIG. 10B is an expanded view of part of the processor core in FIG. 10A according to embodiments of the disclosure. FIG. 10B includes an L1 data cache 1006A, which is part of the L1 cache 1006, as well as more detail regarding the vector unit 1010 of FIG. 10A and the vector registers 1014 of FIG. 10A. Specifically, the vector unit 1010 is a 16-wide vector processing unit (VPU) (see the 16-wide ALU 1028), which executes one or more of integer, single-precision float, and double-precision float instructions. The VPU supports swizzling the register inputs with swizzle unit 1020, numeric conversion with numeric convert units 1022A-B, and replication with replicate unit 1024 on the memory input. Write mask registers 1026 allow predicating resulting vector writes.

Figure 11:
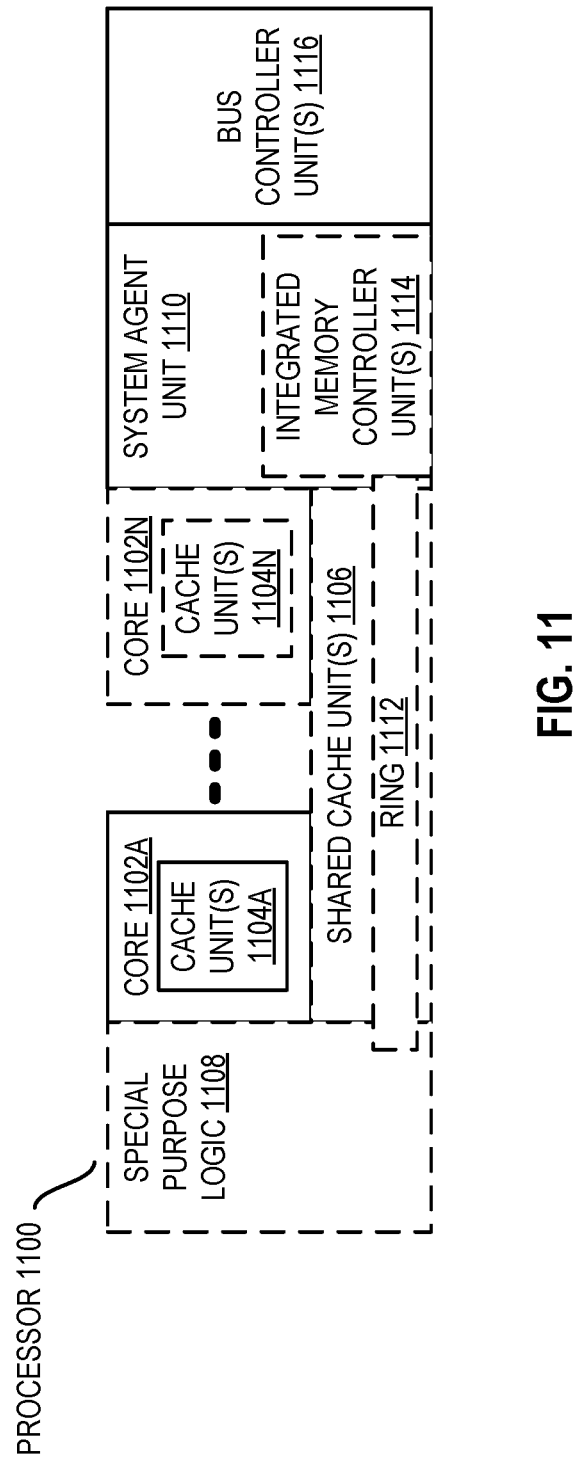
FIG. 11 is a block diagram of a processor that may have more than one core, may have an integrated memory controller, and may have integrated graphics according to embodiments of the disclosure.

FIG. 11 is a block diagram of a processor 1100 that may have more than one core, may have an integrated memory controller, and may have integrated graphics according to embodiments of the disclosure. The solid lined boxes in FIG. 11 illustrate a processor 1100 with a single core 1102A, a system agent 1110, a set of one or more bus controller units 1116, while the optional addition of the dashed lined boxes illustrates an alternative processor 1100 with multiple cores 1102A-N, a set of one or more integrated memory controller unit(s) 1114 in the system agent unit 1110, and special purpose logic 1108.

Thus, different implementations of the processor 1100 may include: 1) a CPU with the special purpose logic 1108 being integrated graphics and/or scientific (throughput) logic (which may include one or more cores), and the cores 1102A-N being one or more general purpose cores (e.g., general purpose in-order cores, general purpose out-of-order cores, a combination of the two); 2) a coprocessor with the cores 1102A-N being a large number of special purpose cores intended primarily for graphics and/or scientific (throughput); and 3) a coprocessor with the cores 1102A-N being a large number of general purpose in-order cores. Thus, the processor 1100 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 1100 may be a part of and/or may be implemented on one or more substrates using any of a number of process technologies, such as, for example, bipolar complementary metal-oxide-semiconductor (BiCMOS), complementary metal-oxide-semiconductor (CMOS), or n-type metal-oxide-semiconductor (NMOS).

The memory hierarchy includes one or more levels of cache within the cores, a set or one or more shared cache units 1106, and external memory (not shown) coupled to the set of integrated memory controller units 1114. The set of shared cache units 1106 may include one or more mid-level caches, such as level 2 (L2), level 3 (L3), level 4 (L4), or other levels of cache, a last level cache (LLC), and/or combinations thereof. While in one embodiment a ring based interconnect unit 1112 interconnects the special purpose (e.g., integrated graphics) logic 1108, the set of shared cache units 1106, and the system agent unit 1110/integrated memory controller unit(s) 1114, alternative embodiments may use any number of well-known techniques for interconnecting such units. In one embodiment, coherency is maintained between one or more cache units 1106 and cores 1102-A-N.

In some embodiments, one or more of the cores 1102A-N are capable of multi-threading. The system agent 1110 includes those components coordinating and operating cores 1102A-N. The system agent unit 1110 may include for example a power control unit (PCU) and a display unit. The PCU may be or include logic and components needed for regulating the power state of the cores 1102A-N and the special purpose (e.g., integrated graphics) logic 1108. The display unit is for driving one or more externally connected displays.

The cores 1102A-N may be homogenous or heterogeneous in terms of architecture instruction set; that is, two or more of the cores 1102A-N may be capable of executing the same instruction set, while others may be capable of executing only a subset of that instruction set or a different instruction set.

Exemplary Computer Architectures

FIGS. 12-15 are block diagrams of exemplary computer architectures. Other system designs and configurations known in the arts for laptops, desktops, handheld personal computers (PCs), personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 12:
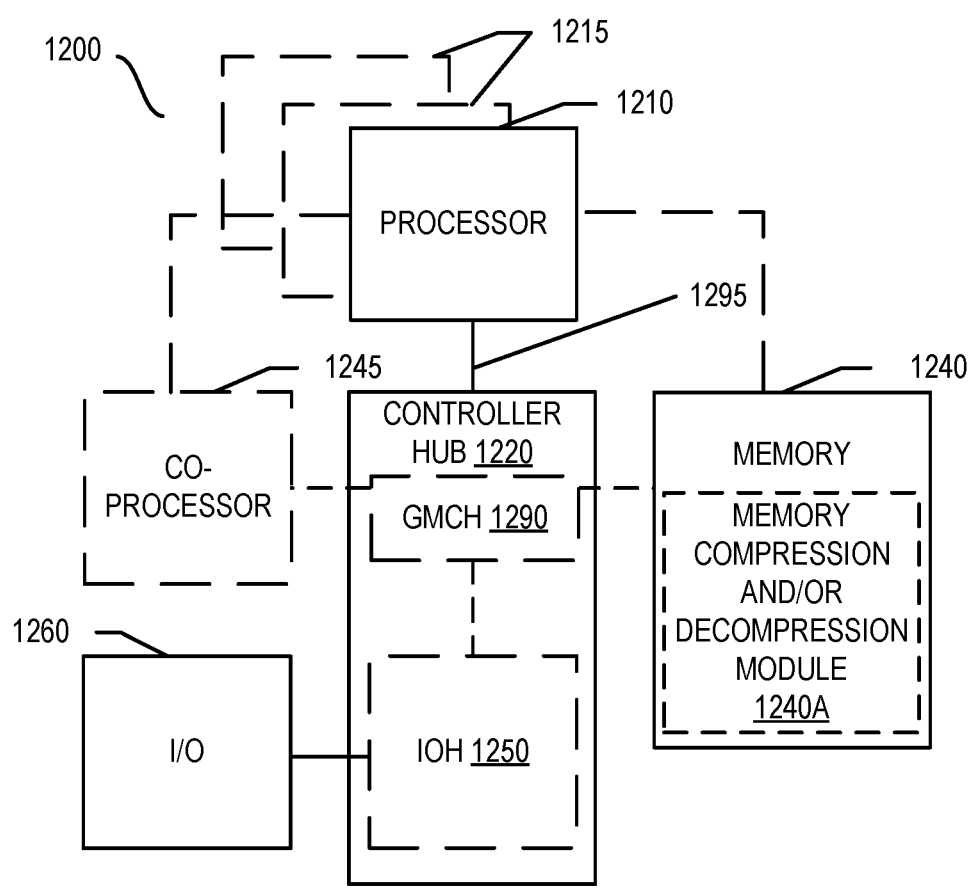
FIG. 12 is a block diagram of a system in accordance with one embodiment of the present disclosure.

Referring now to FIG. 12, shown is a block diagram of a system 1200 in accordance with one embodiment of the present disclosure. The system 1200 may include one or more processors 1210, 1215, which are coupled to a controller hub 1220. In one embodiment the controller hub 1220 includes a graphics memory controller hub (GMCH) 1290 and an Input/Output Hub (IOH) 1250 (which may be on separate chips); the GMCH 1290 includes memory and graphics controllers to which are coupled memory 1240 and a coprocessor 1245; the IOH 1250 couples input/output (I/O) devices 1260 to the GMCH 1290. Alternatively, one or both of the memory and graphics controllers are integrated within the processor (as described herein), the memory 1240 and the coprocessor 1245 are coupled directly to the processor 1210, and the controller hub 1220 is on a single chip with the IOH 1250. Memory 1240 may include a memory compression and/or decompression module 1240A, for example, to store code that when executed causes a processor to perform any method of this disclosure.

The optional nature of additional processors 1215 is denoted in FIG. 12 with broken lines. Each processor 1210, 1215 may include one or more of the processing cores described herein and may be some version of the processor 1100.

The memory 1240 may be, for example, dynamic random access memory (DRAM), phase change memory (PCM), or a combination of the two. For at least one embodiment, the controller hub 1220 communicates with the processor(s) 1210, 1215 via a multi-drop bus, such as a frontside bus (FSB), point-to-point interface such as QuickPath Interconnect (QPI), or similar connection 1295.

In one embodiment, the coprocessor 1245 is a special-purpose processor, such as, for example, a high-throughput MIC processor, a network or communication processor, compression engine, graphics processor, GPGPU, embedded processor, or the like. In one embodiment, controller hub 1220 may include an integrated graphics accelerator.

There can be a variety of differences between the physical resources 1210, 1215 in terms of a spectrum of metrics of merit including architectural, microarchitectural, thermal, power consumption characteristics, and the like.

In one embodiment, the processor 1210 executes instructions that control data processing operations of a general type. Embedded within the instructions may be coprocessor instructions. The processor 1210 recognizes these coprocessor instructions as being of a type that should be executed by the attached coprocessor 1245. Accordingly, the processor 1210 issues these coprocessor instructions (or control signals representing coprocessor instructions) on a coprocessor bus or other interconnect, to coprocessor 1245. Coprocessor 1245 accepts and executes the received coprocessor instructions.

Figure 13:
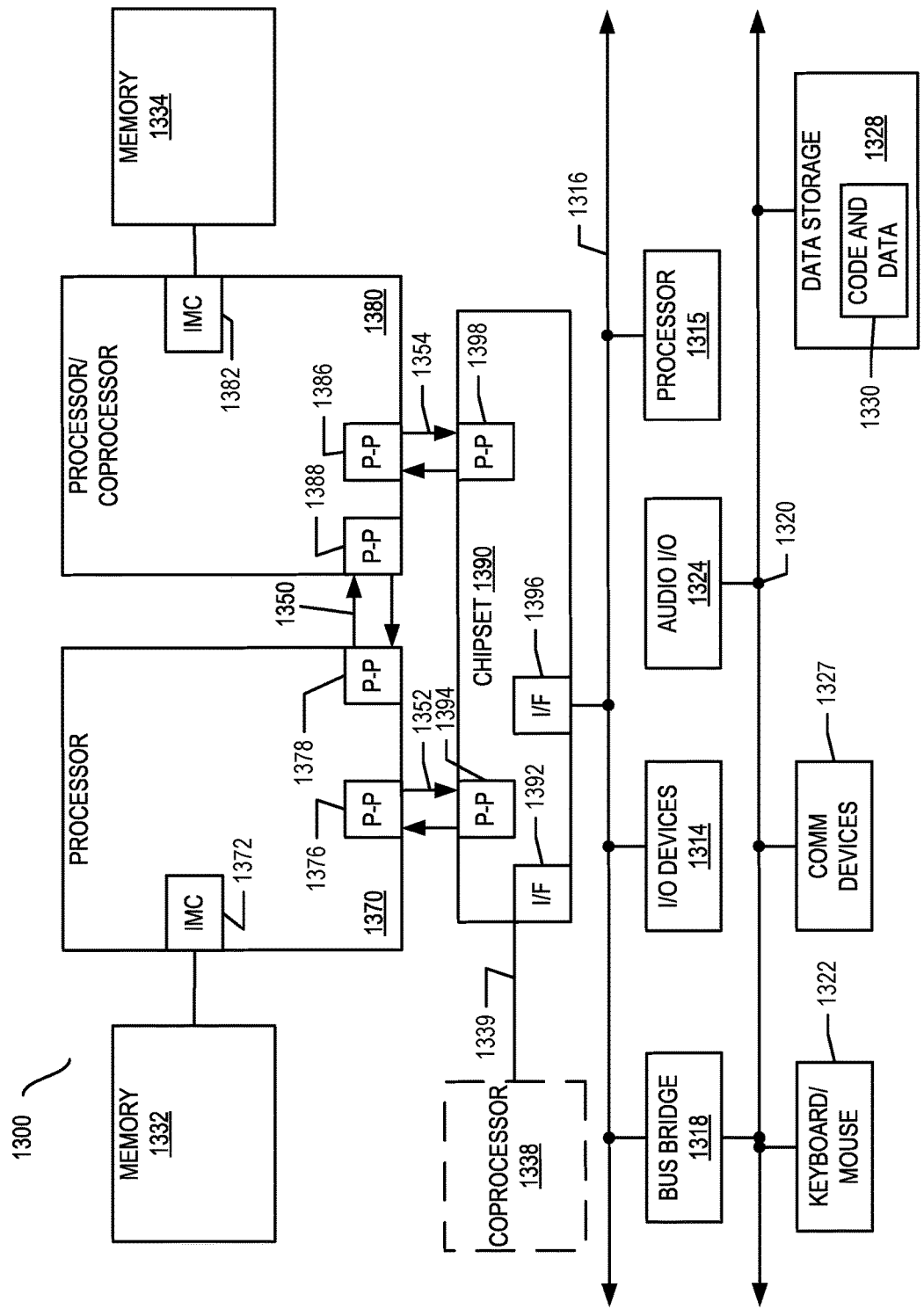
FIG. 13 is a block diagram of a more specific exemplary system in accordance with an embodiment of the present disclosure.

Referring now to FIG. 13, shown is a block diagram of a first more specific exemplary system 1300 in accordance with an embodiment of the present disclosure. As shown in FIG. 13, multiprocessor system 1300 is a point-to-point interconnect system, and includes a first processor 1370 and a second processor 1380 coupled via a point-to-point interconnect 1350. Each of processors 1370 and 1380 may be some version of the processor 1100. In one embodiment of the disclosure, processors 1370 and 1380 are respectively processors 1210 and 1215, while coprocessor 1338 is coprocessor 1245. In another embodiment, processors 1370 and 1380 are respectively processor 1210 and coprocessor 1245.

Processors 1370 and 1380 are shown including integrated memory controller (IMC) units 1372 and 1382, respectively. Processor 1370 also includes as part of its bus controller units point-to-point (P-P) interfaces 1376 and 1378; similarly, second processor 1380 includes P-P interfaces 1386 and 1388. Processors 1370, 1380 may exchange information via a point-to-point (P-P) interface 1350 using P-P interface circuits 1378, 1388. As shown in FIG. 13, IMCs 1372 and 1382 couple the processors to respective memories, namely a memory 1332 and a memory 1334, which may be portions of main memory locally attached to the respective processors.

Processors 1370, 1380 may each exchange information with a chipset 1390 via individual P-P interfaces 1352, 1354 using point to point interface circuits 1376, 1394, 1386, 1398. Chipset 1390 may optionally exchange information with the coprocessor 1338 via a high-performance interface 1339. In one embodiment, the coprocessor 1338 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 1390 may be coupled to a first bus 1316 via an interface 1396. In one embodiment, first bus 1316 may be a Peripheral Component Interconnect (PCI) bus, or a bus such as a PCI Express bus or another third generation I/O interconnect bus, although the scope of the present disclosure is not so limited.

As shown in FIG. 13, various I/O devices 1314 may be coupled to first bus 1316, along with a bus bridge 1318 which couples first bus 1316 to a second bus 1320. In one embodiment, one or more additional processor(s) 1315, such as coprocessors, high-throughput MIC processors, GPGPU's, accelerators (such as, e.g., graphics accelerators or digital signal processing (DSP) units), field programmable gate arrays, or any other processor, are coupled to first bus 1316. In one embodiment, second bus 1320 may be a low pin count (LPC) bus. Various devices may be coupled to a second bus 1320 including, for example, a keyboard and/or mouse 1322, communication devices 1327 and a data storage unit 1328 such as a disk drive or other mass storage device which may include instructions/code and data 1330, in one embodiment. Further, an audio I/O 1324 may be coupled to the second bus 1320. Note that other architectures are possible. For example, instead of the point-to-point architecture of FIG. 13, a system may implement a multi-drop bus or other such architecture.

Figure 14:
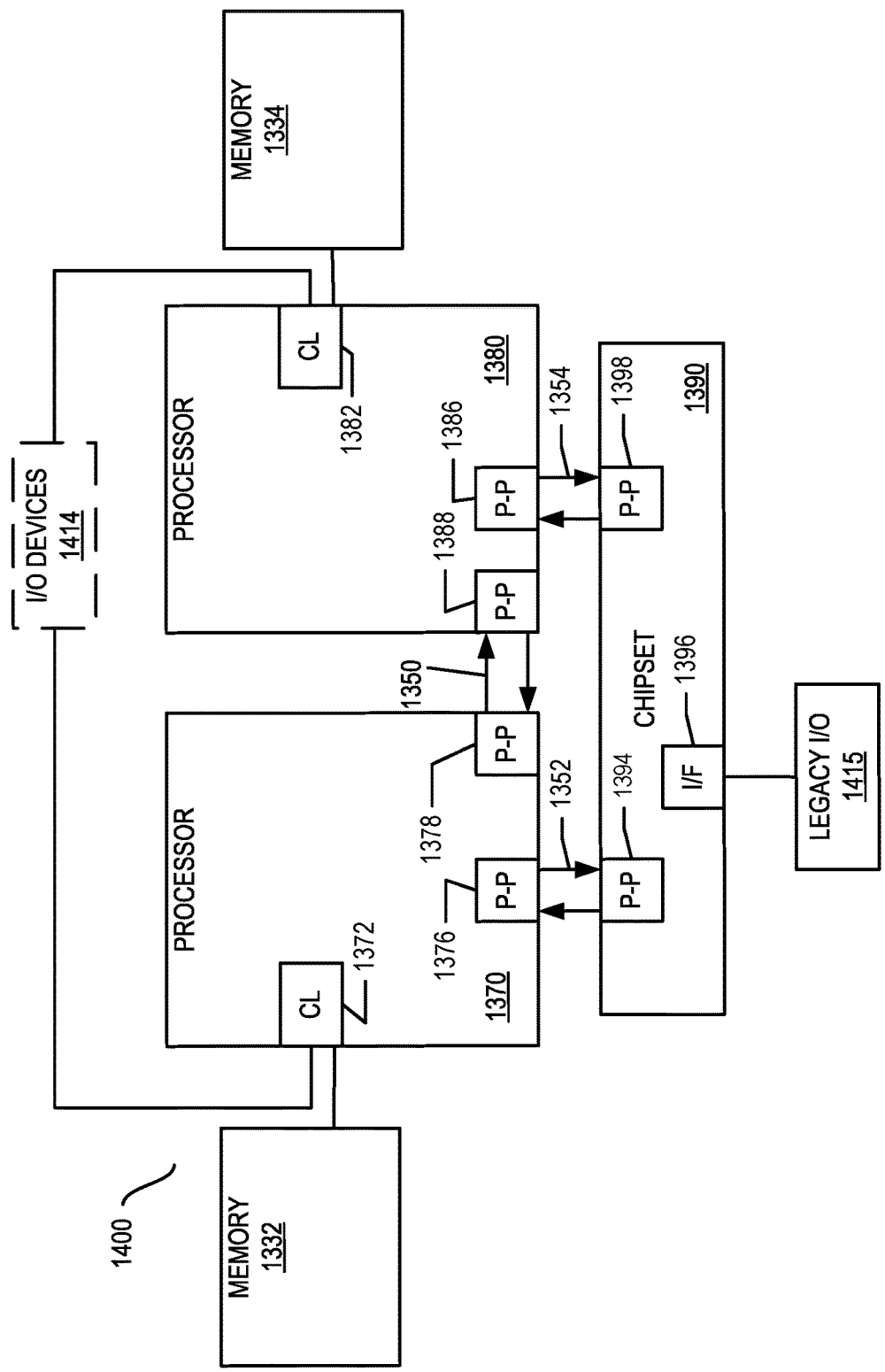
FIG. 14, shown is a block diagram of a second more specific exemplary system in accordance with an embodiment of the present disclosure.

Referring now to FIG. 14, shown is a block diagram of a second more specific exemplary system 1400 in accordance with an embodiment of the present disclosure Like elements in FIGS. 13 and 14 bear like reference numerals, and certain aspects of FIG. 13 have been omitted from FIG. 14 in order to avoid obscuring other aspects of FIG. 14.

FIG. 14 illustrates that the processors 1370, 1380 may include integrated memory and I/O control logic ("CL") 1372 and 1382, respectively. Thus, the CL 1372, 1382 include integrated memory controller units and include I/O control logic. FIG. 14 illustrates that not only are the memories 1332, 1334 coupled to the CL 1372, 1382, but also that I/O devices 1414 are also coupled to the control logic 1372, 1382. Legacy I/O devices 1415 are coupled to the chipset 1390.

Figure 15:
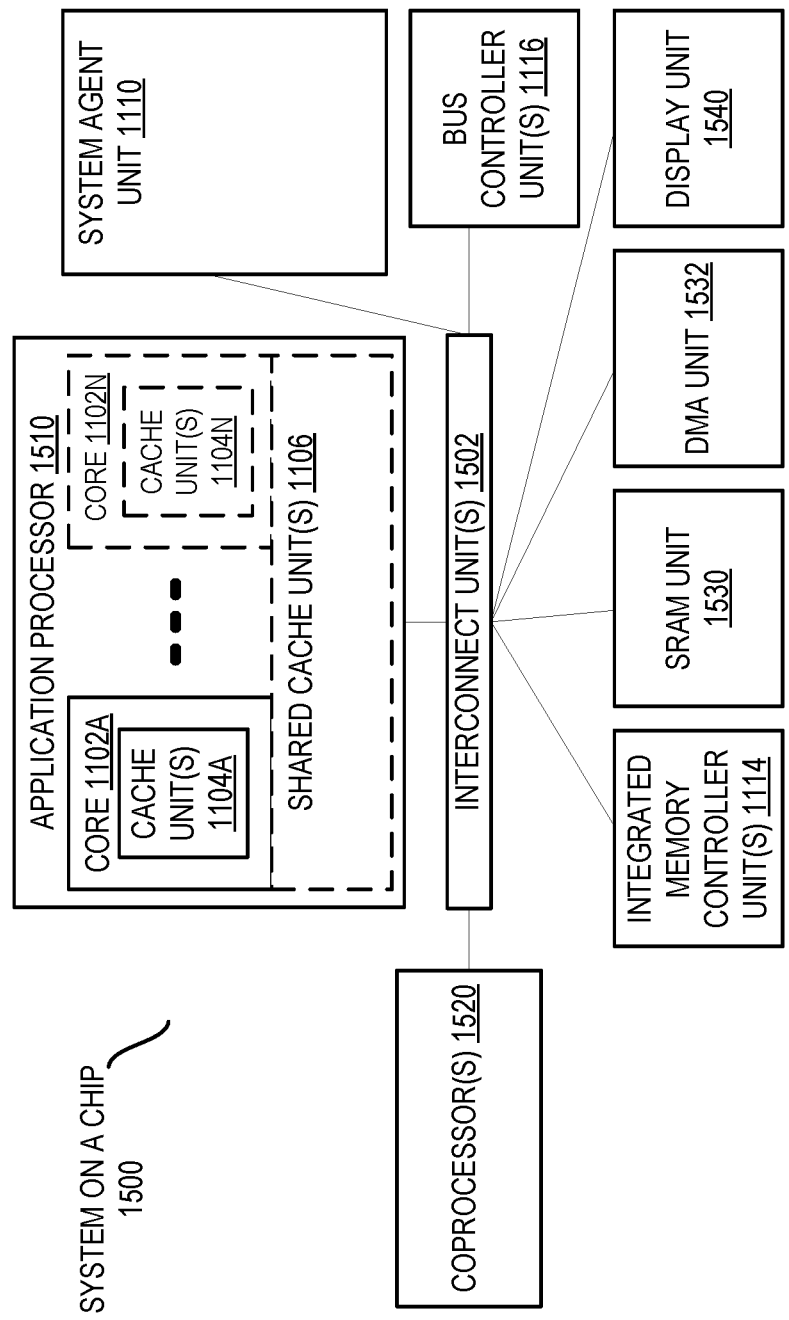
FIG. 15, shown is a block diagram of a system on a chip (SoC) in accordance with an embodiment of the present disclosure.

Referring now to FIG. 15, shown is a block diagram of a SoC 1500 in accordance with an embodiment of the present disclosure. Similar elements in FIG. 11 bear like reference numerals. Also, dashed lined boxes are optional features on more advanced SoCs. In FIG. 15, an interconnect unit(s) 1502 is coupled to: an application processor 1510 which includes a set of one or more cores 1102A-N and shared cache unit(s) 1106; a system agent unit 1110; a bus controller unit(s) 1116; an integrated memory controller unit(s) 1114; a set of one or more coprocessors 1520 which may include integrated graphics logic, an image processor, an audio processor, and a video processor; a static random access memory (SRAM) unit 1530; a direct memory access (DMA) unit 1532; and a display unit 1540 for coupling to one or more external displays. In one embodiment, the coprocessor(s) 1520 include(s) a special-purpose processor, such as, for example, a network or communication processor, compression engine, GPGPU, a high-throughput MIC processor, embedded processor, or the like.

Embodiments (e.g., of the mechanisms) disclosed herein may be implemented in hardware, software, firmware, or a combination of such implementation approaches. Embodiments of the disclosure may be implemented as computer programs or program code executing on programmable systems comprising at least one processor, a storage system (including volatile and non-volatile memory and/or storage elements), at least one input device, and at least one output device.

Program code, such as code 1330 illustrated in FIG. 13, may be applied to input instructions to perform the functions described herein and generate output information. The output information may be applied to one or more output devices, in known fashion. For purposes of this application, a processing system includes any system that has a processor, such as, for example: a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the disclosure also include non-transitory, tangible machine-readable media containing instructions or containing design data, such as Hardware Description Language (HDL), which defines structures, circuits, apparatuses, processors and/or system features described herein. Such embodiments may also be referred to as program products.

Emulation (Including Binary Translation, Code Morphing, Etc.)

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

Figure 16:
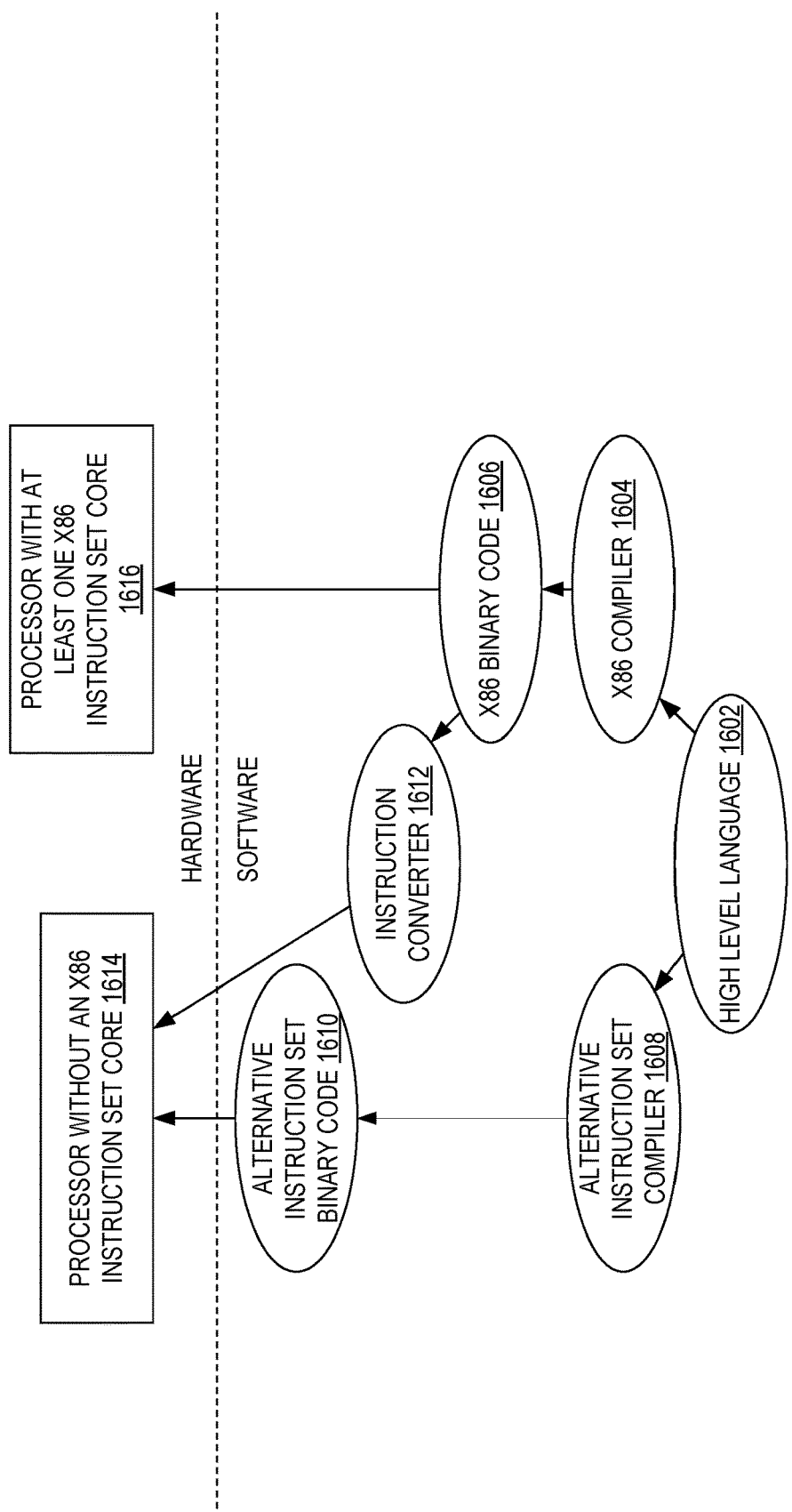
FIG. 16 is a block diagram contrasting the use of a software instruction converter to convert binary instructions in a source instruction set to binary instructions in a target instruction set according to embodiments of the disclosure.

FIG. 16 is a block diagram contrasting the use of a software instruction converter to convert binary instructions in a source instruction set to binary instructions in a target instruction set according to embodiments of the disclosure. In the illustrated embodiment, the instruction converter is a software instruction converter, although alternatively the instruction converter may be implemented in software, firmware, hardware, or various combinations thereof. FIG. 16 shows a program in a high level language 1602 may be compiled using an x86 compiler 1604 to generate x86 binary code 1606 that may be natively executed by a processor with at least one x86 instruction set core 1616. The processor with at least one x86 instruction set core 1616 represents any processor that can perform substantially the same functions as an Intel® processor with at least one x86 instruction set core by compatibly executing or otherwise processing (1) a substantial portion of the instruction set of the Intel® x86 instruction set core or (2) object code versions of applications or other software targeted to run on an Intel® processor with at least one x86 instruction set core, in order to achieve substantially the same result as an Intel® processor with at least one x86 instruction set core. The x86 compiler 1604 represents a compiler that is operable to generate x86 binary code 1606 (e.g., object code) that can, with or without additional linkage processing, be executed on the processor with at least one x86 instruction set core 1616. Similarly, FIG. 16 shows the program in the high level language 1602 may be compiled using an alternative instruction set compiler 1608 to generate alternative instruction set binary code 1610 that may be natively executed by a processor without at least one x86 instruction set core 1614 (e.g., a processor with cores that execute the instruction set of MIPS Technologies of Sunnyvale, Calif. and/or that execute the instruction set of ARM Holdings of Sunnyvale, Calif.). The instruction converter 1612 is used to convert the x86 binary code 1606 into code that may be natively executed by the processor without an x86 instruction set core 1614. This converted code is not likely to be the same as the alternative instruction set binary code 1610 because an instruction converter capable of this is difficult to make; however, the converted code will accomplish the general operation and be made up of instructions from the alternative instruction set. Thus, the instruction converter 1612 represents software, firmware, hardware, or a combination thereof that, through emulation, simulation or any other process, allows a processor or other electronic device that does not have an x86 instruction set processor or core to execute the x86 binary code 1606.

What is claimed is:

1. A memory controller comprising:
   a connection to a memory; and
   a hardware compression engine to:
   receive a plurality of sections of a block of data from the memory to compress,
   determine when each section of the plurality of sections is one of a zero value, a full match to an entry in a dictionary of the memory controller comprising a plurality of entries with a value and an index, a partial match to an entry in the dictionary, and a no match to any entry in the dictionary,
   encode a tag for each section to indicate the one of the zero value, the full match, the partial match, and the no match,
   encode a literal when a section is the no match, an index to an entry in the dictionary when a section is the full match, and an index to an entry in the dictionary and non-matching bits when a section is the partial match, and
   update an entry in the dictionary with a value of a section when a section is the no match, wherein tags for the plurality of sections are to be output from the hardware compression engine in a single field, literals for the plurality of sections are to be output from the hardware compression engine in a single field, indexes for the plurality of sections are to be output from the hardware compression engine in a single field, and non-matching bits for the plurality of sections are to be output from the hardware compression engine in a single field.

2. The memory controller of claim 1, wherein a tag is the only output from the hardware compression engine for the zero value.

3. The memory controller of claim 1, wherein the hardware compression engine is to perform parallel lookups into the dictionary for each of the plurality of sections that are received by the hardware compression engine.

4. The memory controller of claim 1, wherein literals for the plurality of sections are to be output from the hardware compression engine in a single field in a same order as in the block of data.

5. The memory controller of claim 1, wherein the hardware compression engine is to generate a hash for each of the plurality of sections of a block of data to use as an index in the dictionary.

6. The memory controller of claim 1, wherein the hardware compression engine is to, when indices for multiple of the plurality of sections are the same, update the entry in the dictionary with the value of the section that is most recent in a same order as in the block of data.

7. The memory controller of claim 1, wherein the hardware compression engine is to initially populate the dictionary with a plurality of most common values of sections of the block of data other than zero values.

8. A method comprising:
   receiving a plurality of sections of a block of data from a memory to compress with a hardware compression engine;
   determining with the hardware compression engine when each section of the plurality of sections is one of a zero value, a full match to an entry in a dictionary of the hardware compression engine comprising a plurality of entries with a value and an index, a partial match to an entry in the dictionary, and a no match to any entry in the dictionary;
   encoding with the hardware compression engine a tag for each section to indicate the one of the zero value, the full match, the partial match, and the no match;
   encoding with the hardware compression engine a literal when a section is the no match, an index to an entry in the dictionary when a section is the full match, and an index to an entry in the dictionary and non-matching bits when a section is the partial match;
   updating with the hardware compression engine an entry in the dictionary with a value of a section when a section is the no match; and
   outputting tags for the plurality of sections in a single field, literals for the plurality of sections in a single field, indexes for the plurality of sections in a single field, and non-matching bits for the plurality of sections in a single field.

9. The method of claim 8, further comprising only outputting a tag for the zero value.

10. The method of claim 8, further comprising performing parallel lookups into the dictionary for each of the plurality of sections that are received by the hardware compression engine.

11. The method of claim 8, further comprising outputting literals for the plurality of sections in a single field in a same order as in the block of data.

12. The method of claim 8, further comprising generating a hash for each of the plurality of sections of a block of data to use as an index in the dictionary.

13. The method of claim 8, further comprising, when indices for multiple of the plurality of sections are the same, updating the entry in the dictionary with the value of the section that is most recent in a same order as in the block of data.

14. The method of claim 8, further comprising initially populating the dictionary with a plurality of most common values of sections of the block of data other than zero values.

15. A non-transitory machine readable medium that stores code that when executed by a machine causes the machine to perform a method comprising:
   receiving a plurality of sections of a block of data from a memory to compress with a hardware compression engine;
   determining with the hardware compression engine when each section of the plurality of sections is one of a zero value, a full match to an entry in a dictionary of the hardware compression engine comprising a plurality of entries with a value and an index, a partial match to an entry in the dictionary, and a no match to any entry in the dictionary;
   encoding with the hardware compression engine a tag for each section to indicate the one of the zero value, the full match, the partial match, and the no match;
   encoding with the hardware compression engine a literal when a section is the no match, an index to an entry in the dictionary when a section is the full match, and an index to an entry in the dictionary and non-matching bits when a section is the partial match;

updating with the hardware compression engine an entry in the dictionary with a value of a section when a section is the no match; and outputting tags for the plurality of sections in a single field, literals for the plurality of sections in a single field, indexes for the plurality of sections in a single field, and non-matching bits for the plurality of sections in a single field.

16. The non-transitory machine readable medium of claim 15, wherein the method further comprises only outputting a tag for the zero value.

17. The non-transitory machine readable medium of claim 15, wherein the method further comprises performing parallel lookups into the dictionary for each of the plurality of sections that are received by the hardware compression engine.

18. The non-transitory machine readable medium of claim 15, wherein the method further comprises outputting literals for the plurality of sections in a single field in a same order as in the block of data.

19. The non-transitory machine readable medium of claim 15, wherein the method further comprises generating a hash for each of the plurality of sections of a block of data to use as an index in the dictionary.

20. The non-transitory machine readable medium of claim 15, wherein the method further comprises, when indices for multiple of the plurality of sections are the same, updating the entry in the dictionary with the value of the section that is most recent in a same order as in the block of data.

21. The non-transitory machine readable medium of claim 15, wherein the method further comprises initially populating the dictionary with a plurality of most common values of sections of the block of data other than zero values.

22. The memory controller of claim 1, further comprising an encryption engine between the hardware compression engine and the connection to memory along a write data path.

23. The method of claim 8, further comprising encrypting the tags, the literals, the indexes, and the non-matching bits output from the hardware compression engine.

24. The non-transitory machine readable medium of claim 15, wherein the method further comprises encrypting the tags, the literals, the indexes, and the non-matching bits output from the hardware compression engine.

* * * * *